(12) United States Patent
Sugimoto

(10) Patent No.: US 6,493,654 B1
(45) Date of Patent: Dec. 10, 2002

(54) FAULT DISTRIBUTION ANALYZING SYSTEM

(75) Inventor: Masaaki Sugimoto, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/475,067

(22) Filed: Dec. 30, 1999

(30) Foreign Application Priority Data

Jan. 7, 1999 (JP) .......................................... 11-001680

(51) Int. Cl.⁷ ............................................... G06F 11/00
(52) U.S. Cl. ........................ 702/185; 702/94; 702/117; 702/179; 702/181
(58) Field of Search .......................... 702/94, 117, 179, 702/181, 185

(56) References Cited

U.S. PATENT DOCUMENTS

| | | | | |
|---|---|---|---|---|
| 5,905,650 A | * | 5/1999 | Tsutsui et al. | 364/468.17 |
| 6,185,324 B1 | * | 2/2001 | Ishihara et al. | 382/149 |
| 6,349,240 B2 | * | 2/2002 | Ogawa et al. | 700/121 |
| 6,374,199 B1 | * | 4/2002 | Sugimoto | 703/2 |

FOREIGN PATENT DOCUMENTS

| | | |
|---|---|---|
| JP | 61-23327 | 1/1986 |
| JP | 1-216278 | 8/1989 |
| JP | 5-77178 | 10/1993 |
| JP | 7-221156 | 8/1995 |
| JP | 9-270012 | 10/1997 |
| JP | 10-89931 | 4/1998 |
| JP | A 11-186354 | 7/1999 |

* cited by examiner

*Primary Examiner*—Marc S. Hoff
*Assistant Examiner*—Felix Suarez
(74) *Attorney, Agent, or Firm*—Young & Thompson

(57) ABSTRACT

A method of analyzing a distribution of fault elements is applied to a semiconductor integrated circuit including a plurality of elements which are repeatedly arranged in a pitch of one length unit in a specific direction. The method is accomplished by generating a position of each of fault elements in the semiconductor integrated circuit, and by performing a first determination of whether an appearance expectation function value is larger than a reference value, for each of divisors of the number of length units between fault elements, the number of length units being larger than one length unit. Also, the method is accomplished by performing a second determination of whether a distribution of the fault elements includes a regular distribution, based on the appearance expectation function value and a reference value, and by representing the determining result of the second determination.

39 Claims, 24 Drawing Sheets

HORIZONTAL DIRECTION

FAULT DISTRIBUTION ANALYZING SYSTEM

BACKGROUND OF THE INVENTION

1. Field of the Invention

The present invention relates to a fault distribution analyzing system which analyzes a distribution of fault elements of a semiconductor integrated circuit in which circuit elements are arranged regularly.

2. Description of the Related Art

When a semiconductor integrated circuit has regularly arranged circuit elements and a distribution of fault circuit elements contained in the semiconductor integrated circuit is analyzed, the distribution of fault elements can be visually grasped if the positions of the fault elements are recorded. For example, when the circuit elements are divided into blocks and all of the circuit elements contained in one of the blocks are in failure, the block can be determined to be fault. When two adjacent circuit elements are in failure, the 2-bit pair can be determined to be in failure. Also, when one circuit element is independently in failure, the bit can be determined to be in failure. Moreover, when the neighbor elements are in failure massively, a bit group can be determined to be in failure.

The analysis of the distribution of fault elements is called a bit map analysis. The analysis is especially effective when the distribution of fault elements contained in a semiconductor integrated circuit such as a memory LSI or a memory mounting type logic LSI is analyzed. However, the number of elements contained in one semiconductor integrated circuit reaches 10,000,000 or more with the high integration of the semiconductor integrated circuit in recent years. For this reason, it is difficult for an operator to carry out the whole analysis of the distribution of fault elements based on the bit map analysis. Therefore, the technique for automatically analyzing the distribution of fault elements contained in the semiconductor integrated circuit is proposed in Japanese Laid Open Patent Application (JP-A-showa 61-23327) and Japanese Laid Open Patent Application (JP-A-Heisei 1-216278).

However, there are the following problems in the above-mentioned conventional examples of fault distribution analyzing apparatus.

First, it is difficult to determine whether fault elements distributed in a low density in a wide area over the whole semiconductor integrated circuit shows an irregular distribution or is contained in a regular distribution. Generally, when an analysis technical expert analyzes the distribution of fault elements contained in the semiconductor integrated circuit, the analysis technical expert observes the whole distribution at a low magnification and determines an area with a high fault element density. Then, the analysis technical expert observes the determined area at a high magnification and determines a correct position of the fault element and the regularity of the distribution of fault elements. However, when the fault elements are distributed in a low density in the wide area, the observation area at the high magnification gets wide. Therefore, the analysis by the analysis technical expert is difficult actually.

Second, it is difficult to find the period of the regularity, even when the regularity is discovered in the distribution of fault elements. The reason is that even if a position coordinate frequency distribution of fault elements is determined, the position coordinate range is wide so that the number of fault elements for position coordinate is 1 or a few. Also, this is because the distribution of the fault elements is low in density and is wide in area. In this way, it is difficult to correctly determine the period of the distributions of fault elements.

Third, there is another problem that the distribution of fault elements cannot be stored in the storage and correctly searched by a computer. That is, when the position coordinate of each fault element is to be searched, the number of fault element increases so that the data to be stored has become enormous in case of a semiconductor integrated circuit of a high integration. For this reason, because a storage unit had been saturated at a short time, the conventional fault distribution analyzing apparatus cannot be used in practical use.

On the other hand, a system searching the ratio of the number of fault elements and all the elements is known. However, in this system, a spatial distribution of fault elements cannot be represented, because the system does not contain the data indicative of the position coordinate of the fault element.

Moreover, a system is known which uses a histogram in which the number of fault elements is counted in accordance with the position coordinate. However, there are not distributions in which histograms are completely coincident with each other. Also, the pattern of the histogram becomes different in accordance with the increase of elements in a semiconductor integrated circuit. Therefore, it is difficult to search the histogram having the same pattern.

In conjunction with the above description, method of manufacturing an integrated circuit is disclosed in Japanese Examined Patent application (JP-B-Heisei 5-77178). This reference is directed to a method of manufacturing an integrated circuit which sometimes possibly contains any fault on a manufacturing process. The fault cannot be visually detected or requires an excessive long visual test for the detection. In this reference, a data base is produced to show a response which is caused by a specific fault of a type in response to a series of electric test signals. The series of electric test signals are applied to a manufactured integrated circuit. When any fault is detected, the manufacturing condition is examined so as to clearly specify the fault. Thus, the fault is avoided.

Also, a fault analyzing system of a semiconductor circuit is disclosed in Japanese Laid Open Patent Application (JP-A-Heisei 7-221156). In this reference, the fault analyzing system (101) carries out analysis based on a data obtained through an alien substance test (102) and an outward appearance test (103) in a manufacturing process (111), a data obtained through a final wafer test (112) and a data obtained through a fail bit (FB) analysis system (105). The fail bit analysis system (105) extracts a fault position and a fault inducing position from a distribution of fail bits, using the data obtained through the final wafer test (112) and an LSI design data (107). Then, the fail bit analysis system (105) refers to a fault cause now-how data (108) to carry out estimation (113) of a fault cause. An observing unit (109) observes the fault position and the fault inducing position transferred from the fail bit analysis system (105) to specify the fault cause and a fault process. An analysis unit (110) carries out analysis of composition of an alien substance detected by the observing unit (109) to specify the fault cause and the fault process.

Also, a method of detecting and estimating a dot pattern is disclosed in Japanese Laid Open Patent Application (JP-A-Heisei 9-270012). In this reference, a dot pattern is spatially and discretely in a multi-dimensional coordinate system. Each of dots of the pattern takes either of two identifiable states. A measuring unit records a coordinate value and the state value of each dot of the dot pattern. A memory of a computer stores data corresponding to the coordinate value and state value of each dot. Coordinate counters are determined based on the stored data. A n-dimensional vector composed of components formed of the values of the determined coordinate counters is inputted to a neuron circuit network. The neuron circuit network compare the inputted vector and a reference vector corresponding to a reference dot pattern to calculate an output vector. A classification data of the measured dot pattern is outputted based on the output vector.

Also, a pattern test method is disclosed in Japanese Laid Open Patent Application (JP-A-Heisei 10-89931). In this reference, a concerned point (101) and comparison points (102a to 102d) distanced from the concerned point by a repetition pitch are cross-compared to extract comparison points having any difference as fault candidates. Thus, points having 2-dimensional, X-direction or Y-direction repetition can be tested. Thus, a fault point is detected.

SUMMARY OF THE INVENTION

Therefore, an object of the present invention is to provide a method of analyzing a distribution of fault elements contained in a semiconductor integrated circuit, in which it is possible to analyze a distribution of fault elements contained in the semiconductor integrated circuit, a fault distribution analyzing system for the same, and a recording medium in which a program for executing the method is stored.

Another object of the present invention is to provide a method of analyzing a distribution of fault elements contained in a semiconductor integrated circuit, in which it is possible to easily determine whether or not a distribution of fault elements is an irregular distribution, a fault distribution analyzing system for the same, and a recording medium in which a program for executing the method is stored.

Still another object of the present invention is to provide a method of analyzing a distribution of fault elements contained in a semiconductor integrated circuit, in which it is possible to determine whether a distribution of fault elements contains a regular distribution, a fault distribution analyzing system for the same, and a recording medium in which a program for executing the method is stored.

Yet still another object of the present invention is to provide a method of analyzing a distribution of fault elements contained in a semiconductor integrated circuit, in which it is possible to determine a period in a regular distribution when a distribution of fault elements contains the regular distribution, a fault distribution analyzing system for the same, and a recording medium in which a program for executing the method is stored.

In order to achieve an aspect of the present invention, a method of analyzing a distribution of fault elements is applied to a semiconductor integrated circuit including a plurality of elements which are repeatedly arranged in a pitch of one length unit in a specific direction. The method is accomplished by generating a position of each of fault elements in the semiconductor integrated circuit, by performing a first determination of whether an appearance expectation function value is larger than a reference value, for each of divisors of the number of length units between fault elements, the number of length units being larger than one length unit, by performing a second determination of whether a distribution of the fault elements includes a regular distribution, based on the appearance expectation function value and a reference value, and by representing the determining result of the second determination.

Here, in the method, a third determination of a period of the fault elements in the regular distribution contained in the distribution of fault elements may be carried out based on the appearance expectation function values, and then the determined period of the fault elements may be represented.

Also, in the performing a second determination, a record of the appearance expectation function value for each of the divisors and a date and time data may be stored in a data base. In this case, data indicative of the distribution of fault elements is preferably stored in the data base in association with the record. Also, the data base may be searched in response to a search instruction with a target divisor to retrieve the appearance expectation function values for the target divisor and the date and time data corresponding to the appearance expectation function values, to represent the searched appearance expectation function values for the target divisor and the date and time data corresponding to the searched appearance expectation function values.

Also, a third determination of a period of the fault elements in the regular distribution contained in the distribution of fault elements may be performed based on the appearance expectation function values to store the determined period of the fault elements in the data base in addition to the record of the appearance expectation function value for each of the divisors and the date and time data. Also, in the performing a third determination, data indicative of the distribution of fault elements may be stored in the data base in association with the record and the determined period. In addition, the data base may be searched in response to a search instruction with a target divisor to retrieve the appearance expectation function values for the target divisor, the date and time data corresponding to the appearance expectation function values and the determined period of the fault elements, to represent the searched appearance expectation function values for the target divisor and the date and time data corresponding to the appearance expectation function values and the determined period of the fault elements.

The reference value is 1, the performing a first determination includes:
calculating an interval between optional two of all the fault elements contained in the semiconductor integrated circuit;
calculating the number of intervals other than 0, as a combination count;
calculating divisors of each of the intervals larger than 1, and for calculating an appearance probability for each of the divisors based on the number of times of appearance of each of the divisors and the combination count; and
calculating the appearance expectation function value for each of the divisors based on the corresponding one of the appearance probabilities and the each divisors. In this case, the calculating the appearance expectation function value may include multiplying each of the appearance probabilities with corresponding one of the divisors, to calculate the appearance expectation function value.

Also, the method may further include:
determining the largest one of the appearance expectation function values and the next largest one of the appearance expectation function values;

determining an absolute value of a difference between a first one of the divisors corresponding to the largest appearance expectation function value and a second one of the divisors corresponding to the next largest appearance expectation function value; and determining a fact that the distribution of fault elements contains a regular distribution with a period based on the absolute value of the difference. In this case, the determining a fact includes:

determining a fact that the distribution of fault elements contains the regular distribution with the period having the first divisor, when the absolute value of the difference is equal to the first divisor. Also, the determining a fact includes:

determining a fact that the distribution of fault elements contains the regular distribution with the period, when the absolute value of the difference is not equal to the first divisor, but when the absolute value of the difference is within a predetermined value.

In order to achieve another aspect of the present invention, a fault distribution analyzing system of a semiconductor integrated circuit including a plurality of elements which are repeatedly arranged in a pitch of one length unit in a specific direction, includes an output unit, and an input unit and a first processor. The input unit supplies a position of each of fault elements in the semiconductor integrated circuit. The first processor determines whether an appearance expectation function value is larger than a reference value, for each of divisors of the number of length units between fault elements, the number of length units being larger than one length unit; determines that a distribution of the fault elements includes a regular distribution, when the appearance expectation function value is larger than the reference value; and outputs the determining result of the second determining means to the output unit.

The fault distribution analyzing system may further include a second processor which determines a period of the fault elements in the regular distribution contained in the distribution of fault elements based on the appearance expectation function values; and outputs the determined period of the fault elements to the output unit. In this case, the fault distribution analyzing system may further include a third processor which has a data base, and stores a record of the appearance expectation function value for each of the divisors and a date and time data in the data base.

In this case, the third processor stores data indicative of the distribution of fault elements in the data base in association with the record. Also, the third processor may search the data base in response to a search instruction with a target divisor to retrieve the appearance expectation function values for the target divisor and the date and time data corresponding to the appearance expectation function values; and outputs the searched appearance expectation function values for the target divisor and the date and time data corresponding to the searched appearance expectation function values to the output unit.

Also, the third processor may determine a period of the fault elements in the regular distribution contained in the distribution of fault elements based on the appearance expectation function values; and store the determined period of the fault elements in the data base in addition to the record of the appearance expectation function value for each of the divisors and the date and time data. In this case, the third processor stores data indicative of the distribution of fault elements in the data base in association with the record and the determined period. Also, the third processor may search the data base in response to a search instruction with a target divisor to retrieve the appearance expectation function values for the target divisor, the date and time data corresponding to the appearance expectation function values and the determined period of the fault elements; and outputs the searched appearance expectation function values for the target divisor and the date and time data corresponding to the appearance expectation function values and the determined period of the fault elements to the output unit.

Also, when the reference value is 1, the first processor may calculate an interval between optional two of all the fault elements contained in the semiconductor integrated circuit; calculate the number of intervals other than 0, as a combination count; calculate divisors of each of the intervals larger than 1, and for calculating an appearance probability for each of the divisors based on the number of times of appearance of each of the divisors and the combination count; and calculate the appearance expectation function value for each of the divisors based on the corresponding one of the appearance probabilities and the each divisors. In this case, the first processor multiplies each of the appearance probabilities with corresponding one of the divisors, to calculate the appearance expectation function value.

Also, the second processor may determine the largest one of the appearance expectation function values and the next largest one of the appearance expectation function values; determine an absolute value of a difference between a first one of the divisors corresponding to the largest appearance expectation function value and a second one of the divisors corresponding to the next largest appearance expectation function value; and determine that the distribution of fault elements contains a regular distribution with a period based on the absolute value of the difference. In this case, when the absolute value of the difference is equal to the first divisor, the second processor may determine that the distribution of fault elements contains the regular distribution with the period having the first divisor. Also, when the absolute value of the difference is not equal to the first divisor, but when the absolute value of the difference is within a predetermined value, the second processor may determine that the distribution of fault elements contains the regular distribution with the period.

In order to achieve still another aspect of the present invention, programs to execute the methods described in association with the aspect may be stored in a recording medium or recording media.

DESCRIPTION OF THE PREFERRED EMBODIMENTS

Hereinafter, the fault distribution analyzing system of the present invention will be described in detail with reference to the attached drawings.

In conjunction with the present invention, there is a copending U.S. patent application Ser. No. 09/219,349 claiming the priority based on Japanese Patent application No. Heisei 9-355926. The disclosure of the copending US patent application is incorporated herein by reference.

First Embodiment

Figure 1:
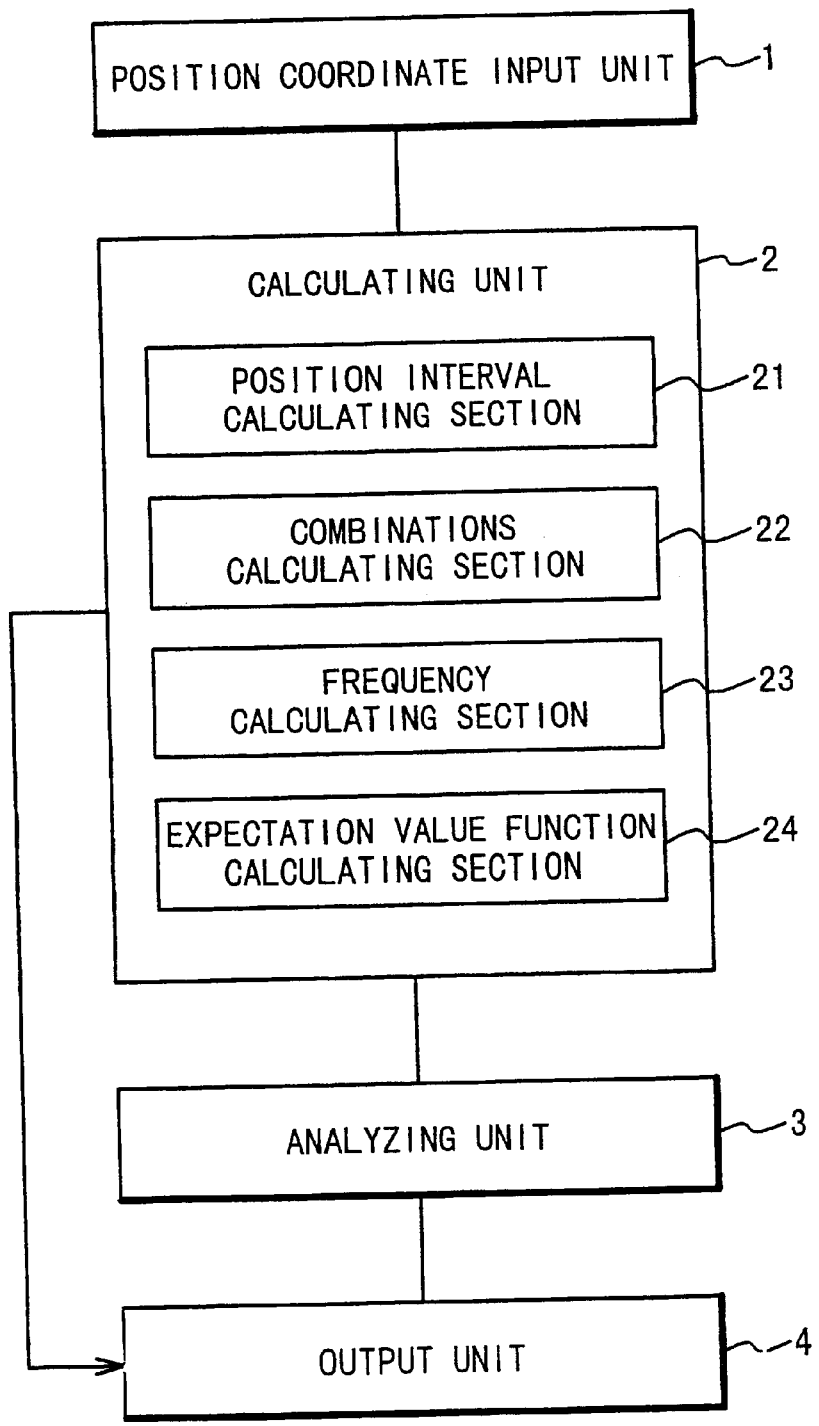
FIG. 1 is a block diagram showing the structure of a fault distribution analyzing system of a semiconductor integrated circuit according to a first embodiment of the present invention.

FIG. 1 is a block diagram showing the structure of the fault distribution analyzing system of the semiconductor integrated circuit according to the first embodiment. Refers to FIG. 1, the fault distribution analyzing system is composed of a position coordinate input unit 1, a calculating unit 2, an analyzing unit 3 and an output unit 4. The calculating unit 2 is composed of a position interval calculating section 21, a combinations calculating section 22, a frequency calculating section 23 and an expectation value function calculating section 24.

The position coordinate inputting unit 1 reads a test data of a semiconductor integrated circuit from a data base. Circuit elements are regularly arranged in the semiconductor integrated circuit. The position coordinate inputting unit 1 inputs a position coordinate x of each of fault elements in the semiconductor integrated circuit in a specific direction and transfers the position coordinate of the fault element to the calculating unit 2.

The position interval calculating section 21 calculates a position coordinate interval $|\Delta x|$ between every two of all the fault elements supplied from position coordinate inputting unit 1 in units of length units based on the position coordinates x of all the fault elements. The number of combinations of two of all the fault elements is $N(=_nC_2=n(n-1)/2)$.

The combinations calculating section 22 calculates the number of combinations $Nx(=N-ux)$ by subtracting the number of combinations ux in which the value of $|\Delta x|$ is 0 from the number of combinations N.

The frequency calculating section 23 determines all of the divisors f in each of the position coordinate intervals $|\Delta x|$. The divisor f is an integer equal to or more than "2" and equal to or less than the maximum value $|\Delta x|_{max}$ of $|\Delta x|$. The frequency calculating section 23 calculates the frequency $\Sigma m(f)$ of each divisor f (hereinafter, to be referred to as a divisor depending frequency).

The expectation value function calculating section 24 multiplies an appearance probability $P(f)(=\Sigma m(f)/Nx)$ of each of the divisors f for the number of combinations Nx determined by the combinations calculating section 22 with the corresponding divisor f over all the divisors f to produce expectation function values $T(f)=f \cdot P(f)$. Because the divisor is multiplied with the appearance probability, the expectation function value becomes "1", if the distribution is irregular. For example, when there are three cards, the appearance probability of one card is ⅓. Since three cards are present, the expectation function value is "1" (=⅓×3). Then, the expectation value function calculating section 24 transfers the calculated expectation function values T(f) to the analyzing unit 3.

The analyzing unit 3 is composed of a computer which executes a predetermined analysis program. The analyzing unit 3 analyzes whether all the expectation function values T(f) calculated by the expectation value function calculating section 24 are equal to or less than "1". When all the expectation function values T(f) are equal to or less than "1", the analyzing unit 3 determines that the distribution of fault elements is an irregular distribution. On the other hand, when one expectation function values T(f) exceeding "1" is contained, the analyzing unit 3 determines that a regular portion is contained in the distribution of fault elements. The analyzing unit 3 transfers the determination result to the output unit 4.

The output unit 4 is composed of a display unit such as a CRT (Cathode Ray Tube) and/or a printer. The output unit 4 outputs the calculation result by the calculating unit 2 and the analysis result by the analyzing unit 3. The output unit 4 may store the calculation result by the calculating unit 2 and the analysis result by the analyzing unit 3 in a recording medium such as a magnetic disk.

It should be noted that the calculating unit 2 may be realized by a computer which executes the programs corresponding to the functions of the position interval calculating section 21, combinations calculating section 22, frequency calculating section 23 and expectation value function calculating section 24. Also, the analyzing unit 3 may be realized by the computer which is identical to the calculating unit 2. In this case, the computer executes a program for the expectation function analysis.

Hereinafter, the processing of the fault distribution analyzing system of the semiconductor integrated circuit according to the first embodiment will be described with reference to the flow chart shown in FIG. 2.

First, the position coordinate x of each of the fault elements contained in a specific direction of the semiconductor integrated circuit to be analyzed is retrieved or inputted from the position coordinate inputting unit 1. The supplied position coordinates x are transferred to the calculating unit 2 from the position coordinate inputting unit 1 (Step S101).

In the calculating unit 2, first, the position interval calculating section 21 calculates the position coordinate intervals $|\Delta x|$ between optional two of the fault elements based on the position coordinates x of the two fault elements over all the fault elements. At this time, the number of combinations is $N(=_nC_2=n(n-1)/2)$. For example, the position interval calculating section 21 counts the number n of position coordinates x, and calculates the number of combinations $N(=_nC_2=n(n-1)/2)$ (Step S102).

Next, the combinations calculating section 22 counts the number of combinations ux, in each of which the value of the position coordinate interval $|\Delta x|$ is "0". After that, the combinations calculating section 22 subtracts the counted value ux from the number of combinations N counted at the step S102 to determine the number of combinations Nx (Step S103).

Next, frequency calculating section 23 determines the divisor f for each of the position coordinate intervals $|\Delta x|$ determined at the step S102. The divisor f which is determined here is an integer equal to or more than "2" and the maximum value of the divisor f is equal to the maximum value $|\Delta x|_{max}$ of the position coordinate intervals $|\Delta x|$ (Step S104). Moreover, the frequency calculating section 23 calculates the frequency $\Sigma m(f)$ for every value of the divisors f determined at the step S103 as the divisor depending frequency (Step S105).

Next, the expectation value function calculating section 24 determines an appearance probability $P(f)=\Sigma m(f)/Nx$ for each of the divisors f for the number of combinations Nx determined by the combinations calculating section 22 and then multiplies the appearance probability with the value of the corresponding divisor f to calculates an expectation function value $T(f)=f \cdot P(f)$. The expectation value function calculating section 24 calculates the expectation function values T(f) over all the divisors f. Then, the calculating unit 2 transfers the expectation function values T(f) calculated by the expectation value function calculating section 24 to the analyzing unit 3 (Step S106). It should be noted that the calculation result of the calculating unit 2 at the above-mentioned steps S102 to S106 is also transferred to the output unit 4.

Next, the analyzing unit 3 checks each of the expectation function values T(f) to determine whether each of the expectation function values T(f) transferred from the calculating unit 2 is equal to or less than "1" (Step S107). When the expectation function values T(f) are all equal to or less than "1", the analyzing unit 3 determines that the distribution of fault elements is an irregular distribution, and transfers the determination result to the output unit 4 (Step S108). On the other hand, when at least one of the expectation function values T(f) exceeds "1", the analyzing unit 3 determines that the distribution of fault elements contains a regular distribution, and transfers the determination result to the output unit 4 (Step S109).

Then, the output unit 4 outputs the calculation result transferred from the calculating unit 2 and the determination result transferred from the analyzing unit 3 as the analysis result (Step S110). Then, the fault analyzing process of this flow chart is ended.

Hereinafter, what analyzing result is obtained from the position coordinates of the fault distribution inputted from the position coordinate inputting unit 1 in the fault distribution analyzing system will be described in detail based on specific examples.

EXAMPLE 1-1

In this example, it is supposed that the number of fault elements in the semiconductor integrated circuit is n=5 and the position coordinates of the fault elements in a specific direction are (x)=(1), (2), (3), (4) and (5).

① The Calculation of the Position Coordinate Intervals $|\Delta x|$ (Step S102)

In this example, the following combinations are possible:

x=2, 3, 4, 5 to coordinate x=1;
x=3, 4, 5 to coordinate x=2;
x=3, 4, 5 to coordinate x=3; and
x=5 to coordinate x=4.

Therefore, the position coordinate intervals $|\Delta x|$ between optional two of the fault elements are:

$$|\Delta x| = |2-1|, |3-1|, |4-1|, |5-1|, |3-2|, |4-2|, |5-2|, |4-3|,$$
$$|5-3|, |5-4|$$
$$= 1, 2, 3, 4, 1, 2, 3, 1, 2, 1.$$

Also, the number of combinations N is:

$$N = {}_nC_2$$
$$= n(n-1)/2$$
$$= 5(5-1)/2$$
$$= 10$$

② The Calculation of the Number of Combinations Nx (Step S103)

Because all the intervals $|\Delta x|>0$, there is not any combination that $|\Delta x|$ is 0 in this example, i.e., ux=0. Therefore, $$Nx = N - ux$$
$$= 10 - 0$$
$$= 10.$$

③ The Calculation of Divisors f (Step S104)

The divisors f which is equal to or more than "2" are determined for each of the position coordinate intervals $|\Delta x|$ as follows:

there is no divisor f to $|\Delta x|=1$;
the divisor f is 2 to $|\Delta x|=2$;
the divisor f is 3 to $|\Delta x|=3$;
the divisors f are 2 and 4 to $|\Delta x|=4$;
there is no divisor f to $|\Delta x|=1$;
the divisor f is 2 to $|\Delta x|=2$;
the divisor f is 3 to $|\Delta x|=3$;
there is no divisor f to $|\Delta x|=1$;
the divisor f is 2 to $|\Delta x|=2$; and
there is no divisor f to $|\Delta x|=1$.

④ The Calculation of Divisor Depending Frequency $\Sigma m(f)$ (Step S105)

The divisor depending frequency $\Sigma m(f)$ is calculated for each of the calculated divisors f as follows:

$$\Sigma m(2)=4;$$
$$\Sigma m(3)=2;$$

and $$\Sigma m(4)=1$$

⑤ The Calculation of Expectation Function Values T(f) (Step S106)

The appearance probability P(f) of each of the above-mentioned divisors f(=2, 3 and 4) is:

$$P(2)=4/10$$
$$P(3)=2/10$$
$$P(4)=1/10$$

Therefore, the expectation function values T(f) to the divisors f are:

$$T(2)=2\times 4/10=0.8$$
$$T(3)=3\times 2/10=0.6$$
$$T(4)=4\times 1/10=0.4$$

⑥ The Analysis of the Fault Distribution (Step S107 to S109)

In this example, the expectation function values T(f) to each of the divisors f(=2, 3 and 4) are between "0" and "1". Therefore, in this example, the fault distribution is determined to be an irregular distribution.

Figure 3:
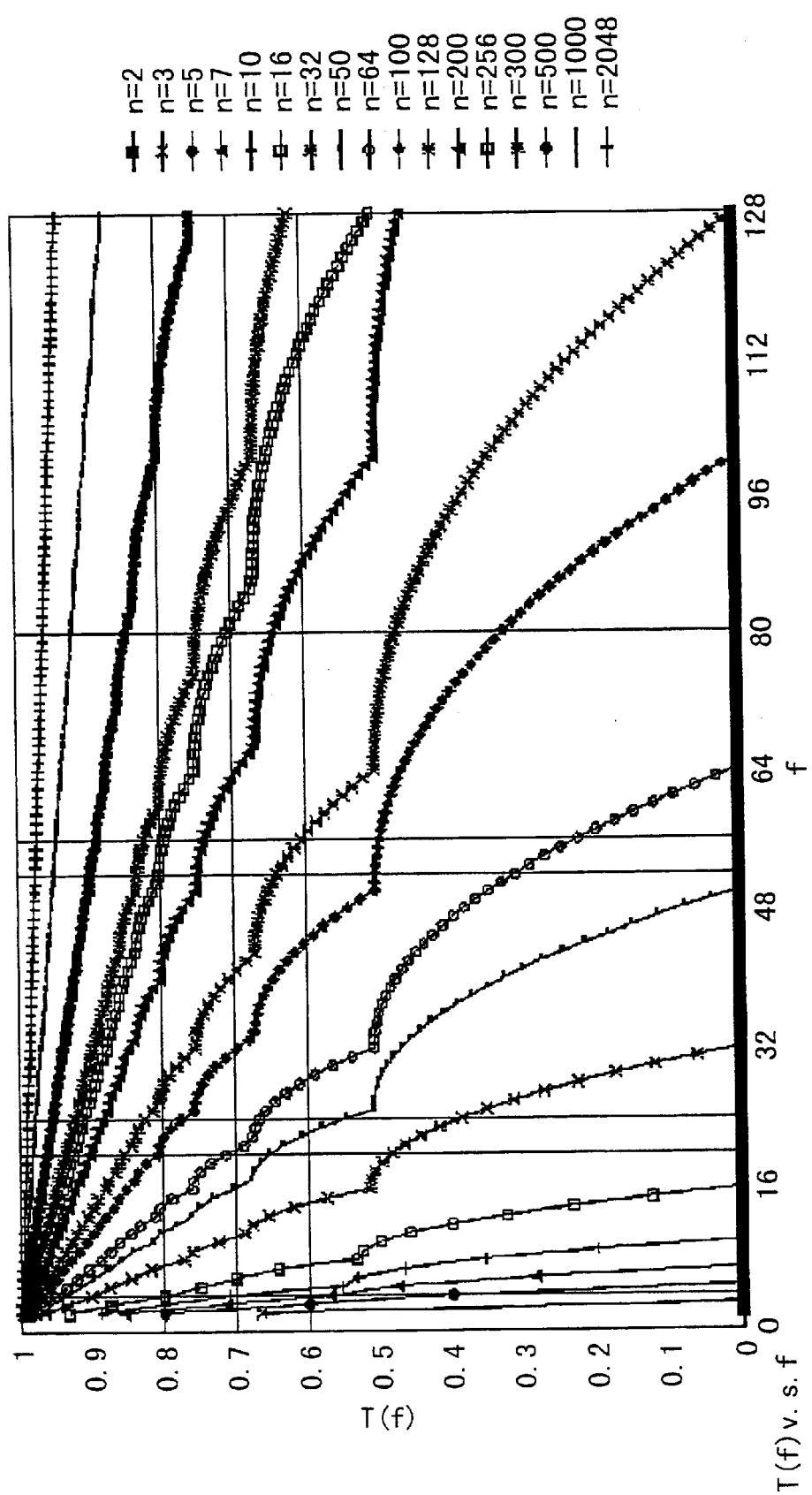
FIG. 3 is a graph showing an example of the relation of expectation function values and corresponding divisors when a fault distribution shows irregular distribution.

A result of the of expectation function values T(f) to the divisor of f=128 is shown in FIG. 3 when a range is extended to the number of fault elements of n=2 to 2048, (x=1 to 2048) as the reference. As seen from the figure, the expectation function value T(f) increases to approach from "0" to "1", as the number of fault elements n decreases. However, the expectation function value T(f) never exceeds "1".

EXAMPLE 1-2

In this example, it is supposed that the number of fault elements in a semiconductor integrated circuit n=6 and the position coordinate of each fault element in the specific direction is (x)=(1), (2), (3), (4), (5), (c). It should be noted that the value of c is equal to either one of "1" to "5".

① The Calculation of the Position Coordinate Intervals $|\Delta x|$ (Step S102)

In this example, the following combinations are possible:
x=2, 3, 4, 5 and c to coordinate x=1;
x=3, 4, 5 and c to coordinate x=2;
x=4, 5 and c to coordinate x=3;
x=5 and c to coordinate x=4; and
x=c to coordinate x=5.

Therefore, the position coordinate intervals $|\Delta x|$ between optional two of the fault elements are:

$$|\Delta x| = |2-1|, |3-1|, |4-1|, |5-1|, |c-1|, |3-2|, |4-2|, |5-2|,$$
$$|c-2|, |4-3|, |5-3|, |c-3|, |5-4|, |c-4|, |c-5|$$
$$= 1, 2, 3, 4, 1, 2, 3, 1, 2, 1,$$
$$|c-1|, |c-2|, |c-3|, |c-4|, |c-5|$$

Also, the number of combinations N is:

$$N = {}_nC_2$$
$$= n(n-1)/2$$
$$= 6(6-1)/2$$
$$= 15$$

② The Calculation of the Number of Combinations Nx (Step S103)

Because the value of c is equal to either one of "1" to "5", $|\Delta x|=0$ in one of $|c-1|, |c-2|, |c-3|, |c-4|$ and $|c-5|$. That is, the number of combinations with $|\Delta x|=0$ is ux=1 in this example. Therefore, $$Nx = N - ux$$
$$= 15 - 1$$
$$= 14.$$

③ The Calculation of Divisors f (Step S104)

The divisors f which meet the condition mentioned above includes the divisors f in the example 1-1 and the divisors f determined based on the value of c. Here, in case of $|c-1|$, $|c-2|, |c-3|, |c-4|$ and $|c-5|$, when c=1, $|\Delta x|=0, 1, 2, 3, 4$;
when c=2, $|\Delta x|=1, 0, 1, 2, 3$;
when c=3, $|\Delta x|=2, 1, 0, 1, 2$;
when c=4, $|\Delta x|=3, 2, 1, 0, 1$; and
when c=5, $|\Delta x|=4, 3, 2, 1, 0$.

In this way, the divisors F when c=1 is the same as those when C=5 and the divisors F when c=2 is the same as those when C=4.

When c=1 or 5, the divisors f are determined as follows:

case of $|\Delta x|=0$ is out of analysis;
there is no divisor f to $|\Delta x|=1$;
the divisor f is 2 to $|\Delta x|=2$;
the divisor f is 3 to $|\Delta x|=3$; and
the divisors f are 2 and 4 to $|\Delta x|=4$.
Also, when c=2 or 4, the divisors f are determined as follows:
there is no divisor f to $|\Delta x|=1$;
case of $|\Delta x|=0$ is out of analysis;
there is no divisor f to $|\Delta x|=1$;
the divisor f is 2 to $|\Delta x|=2$; and
the divisor f is 3 to $|\Delta x|=3$.
Also, when c=3, the divisors f are determined as follows:
the divisor f is 2 to $|\Delta x|=2$;
there is no divisor f to $|\Delta x|=1$;
case of $|\Delta x|=0$ is out of analysis;
there is no divisor f to $|\Delta x|=1$; and
the divisor f is 2 to $|\Delta x|=2$.

④ The Calculation of Divisor Depending Frequency $\Sigma m(f)$ (Step S105)

The divisor depending frequency $\Sigma m(f)$ with no relation to the value of c is calculated for each of the calculated divisors f as follows:

$\Sigma m(2)=4$;

$\Sigma m(3)=2$;

and $\Sigma m(4)=1$

Therefore, the divisor depending frequency $\Sigma m(f)$ to be determined is the above frequencies and the divisor depending frequency $\Sigma m(f)$ with relation to the value of c.

When c=1 or 5, the divisor depending frequencies $\Sigma m(f)$ to be determined are as follows:

$\Sigma m(2)=4+2=6$;

$\Sigma m(3)=2+1=3$;

and $\Sigma m(4)=1+1=2$.

When c=2 or 4, the divisor depending frequencies $\Sigma m(f)$ to be determined are as follows:

$\Sigma m(2)=4+1=5$:

$\Sigma m(3)=2+1=3$;

and $\Sigma m(4)=1$.

When c=3, the divisor depending frequencies $\Sigma m(f)$ to be determined are as follows:

$\Sigma m(2)=4+2=6$;

$\Sigma m(3)=2$;

and $\Sigma m(4)=1$.

⑤ The Calculation of Expectation Function Value $T(f)$ (Step S106)

When c=1 or 5, the appearance probability $P(f)$ of each of the above-mentioned divisors f(=2, 3 and 4) is:

$P(2)=6/14$ $P(3)=3/14$ $P(4)=2/14$

Therefore, the expectation function values $T(f)$ to the divisors f are:

$T(2)=2\times6/14=0.86$;

$T(3)=3\times3/14=0.64$;

and $T(4)=4\times2/14=0.57$.

Also, when c=2 or 4, the appearance probability $P(f)$ of each of the above-mentioned divisors f(=2, 3 and 4) are as follows:

$P(2)=5/14$ $P(3)=3/14$ $P(4)=1/14$

Therefore, the expectation function values $T(f)$ to the divisors f are as follows:

$T(2)=2\times5/14=0.71$;

$T(3)=3\times3/14=0.64$;

and $T(4)=4\times1/14=0.29$.

Also, when c=3, the appearance probability $P(f)$ of each of the above-mentioned divisors f(=2, 3 and 4) are as follows:

$P(2)=6/14$ $P(3)=2/14$ $P(4)=1/14$

Therefore, the expectation function values $T(f)$ to the divisors f are as follows:

$T(2)=2\times6/14=0.86$;

$T(3)=3\times2/14=0.43$;

and $T(4)=4\times1/14=0.29$.

⑥ The Analysis of the Fault Distribution (Step S107 to S109)

In this example, the expectation function values $T(f)$ to each of the divisors f(=2, 3 and 4) are between "0" and "1", even if the value of c is either of values of "1" to "5". Therefore, in this example, the fault distribution is determined to be an irregular distribution, even if the value of c is either of values of "1" to "5".

EXAMPLE 1-3

In this example, it is supposed that the number of fault elements in a semiconductor integrated circuit n=6 and the position coordinate each fault element in the specific direction is (x)=(1), (2), (3), (4), (5), (c). It should be noted that it is supposed to be c=3.

① The Calculation of the Position Coordinate Intervals |Δx| (Step S102)

In this example, the following combinations are possible:

x=2, 3, 3, 4, and 5 to coordinate x=1;
x=3, 3, 4, and 5 to coordinate x=2;
x=3, 4, and 5 to coordinate x=3;
x=3, and 4 to coordinate x=3; and
x=5 to coordinate x=4.

Therefore, the position coordinate intervals |Δx| between optional two of the fault elements are as follows:

$$|\Delta x| = |2-1|, |3-1|, |3-1|, |4-1|, |5-1|, |3-2|, |3-2|, |4-2|,$$
$$|5-2|, |3-3|, |4-3|, |5-3|, |4-3|, |5-3|, |5-4|$$
$$= 1, 2, 2, 3, 4, 1, 1, 2, 3, 0, 1, 2, 1, 2, \text{ and } 1$$

Also, the number of combinations N is:

$$N = {}_nC_2$$
$$= n(n-1)/2$$
$$= 6(6-1)/2$$
$$= 15$$

② The Calculation of the Number of Combinations Nx (Step S103)

Because only |3-3| is |Δx|="0", the number of combinations with |Δx|=0 is ux="1" in this example. Therefore, $$Nx = N - ux$$
$$= 15 - 1$$
$$= 14.$$

③ The Calculation of Divisors f (Step S104)

The divisors f which meet the condition mentioned above are determined as follow for each of the position coordinate intervals |Δx|:

there is no divisor f to |Δx|=1;
the divisor f is 2 to |Δx|=2;
the divisor f is 2 to |Δx|=2;
the divisor f is 3 to |Δx|=3;
the divisors f are 2 and 4 to |Δx|=4;
there is no divisor f to |Δx|=1;
there is no divisor f to |Δx|=1;
the divisor f is 2 to |Δx|=2;
the divisor f is 3 to |Δx|=3;
case of |Δx|=0 is out of analysis;
there is no divisor f to |Δx|=1;
the divisor f is 2 to |Δx|=2;
there is no divisor f to |Δx|=1;
the divisor f is 2 to |Δx|=2; and
there is no divisor f to |Δx|=1.

④ The Calculation of Divisor Depending Frequencies Σm(f) (Step S105)

The divisor depending frequency Σm(f) to each of the divisors f determined mentioned above is calculated as follows:

Σm(2)=6;

Σm(3)=2;

and

Σm(4)=1

⑤ The Calculation of Expectation Function Value T(f) (Step S106).

The appearance probability P(f) of each of the above-mentioned divisors f(=2, 3 and 4) is as follows:

P(2)=6/14

P(3)=2/14

P(4)=1/14

Therefore, the expectation function values T(f) to the divisors f are:

T(2)=2×6/14=0.86;

T(3)=3×2/14=0.43;

and

T(4)=4×1/14=0.29.

⑥ The Analysis of the Fault Distribution (Step S107 to S109)

In this example, the expectation function values T(f) to each of the divisors f(=2, 3 and 4) are between "0" and "1". Therefore, in this example, the fault distribution is determined to be an irregular distribution.

EXAMPLE 1-4

In this example, it is supposed that the number of fault elements in a semiconductor integrated circuit n=7 and the position coordinate to each fault element in the specific direction is (x)=(1), (2), (3), (4), (5), (5) and (c). It should be noted that it is supposed to be c=5.

① The Calculation of the Position Coordinate Intervals |Δx| (Step S102)

In this example, the following combinations are possible:

x=2, 3, 4, 5 and 5 to coordinate x=1;
x=3, 4, 5 and 5 to coordinate x=2;
x=4, 5 and 5 to coordinate x=3;
x=5 and 5 to coordinate x=4; and
x=5 to coordinate x=5.

Therefore, the position coordinate intervals |Δx| between optional two of the fault elements are as follows:

$$|\Delta x| = |2-1|, |3-1|, |4-1|, |5-1|, |5-1|, |3-2|, |4-2|, |5-2|,$$
$$|5-2|, |4-3|, |5-3|, |5-3|, |5-4|, |5-4|, |5-5|$$
$$= 1, 2, 3, 4, 4, 1, 2, 3, 3, 1, 2, 2, 1, 1 \text{ and } 1$$

Also, the number of combinations N is:

$$N = {}_nC_2$$
$$= n(n-1)/2$$
$$= 6(6-1)/2$$
$$= 15$$

② The Calculation of the Number of Combinations Nx (Step S103)

Because only |5-5| is |Δx|=0, the number of combinations with |Δx|=0 is ux=1 in this example. Therefore, $$Nx = N - ux$$
$$= 15 - 1$$
$$= 14.$$

③ The Calculation of Divisors f (Step S104)

The divisors f which meet the condition mentioned above are determined as follow for each of the position coordinate intervals |Δx|:
there is no divisor f to |Δx|=1;
the divisor f is 2 to |Δx|=2;
the divisor f is 3 to |Δx|=3;
the divisors f are 2 and 4 to |Δx|=4;
the divisors f are 2 and 4 to |Δx|=4;
there is no divisor f to |Δx|=1;
the divisor f is 2 to |Δx|=2;
the divisor f is 3 to |Δx|=3;
the divisor f is 3 to |Δx|=3;
there is no divisor f to |Δx|=1;
the divisor f is 2 to |Δx|=2;
the divisor f is 2 to |Δx|=2;
there is no divisor f to |Δx|=1;
there is no divisor f to |Δx|=1; and
case of |Δx|=0 is out of analysis.

④ The Calculation of Divisor Depending Frequency Σm(f) (Step S105)

The divisor depending frequency Σm(f) to each of the divisors f determined mentioned above is calculated as follows:

Σm(2)=6;

Σm(3)=3;

and

Σm(4)=1

⑤ The Calculation of Expectation Function Value T(f) (Step S106).

The appearance probability P(f) of each of the above-mentioned divisors f(=2, 3 and 4) is as follows:

P(2)=6/14

P(3)=3/14

P(4)=2/14

Therefore, the expectation function values T(f) to the divisors f are:

T(2)=2×6/14=0.86;

T(3)=3×2/14=0.64;

and

T(4)=4×2/14=0.57.

⑥ The Analysis of the Fault Distribution (Step S107 to S109)

In this example, the expectation function values T(f) to each of the divisors f(=2, 3 and 4) are between "0" and "1". Therefore, in this example, the fault distribution is determined to be an irregular distribution.

Moreover, the fault distribution analyzing system in the first embodiment will be described, using actually obtained data as an example.

Figure 4:
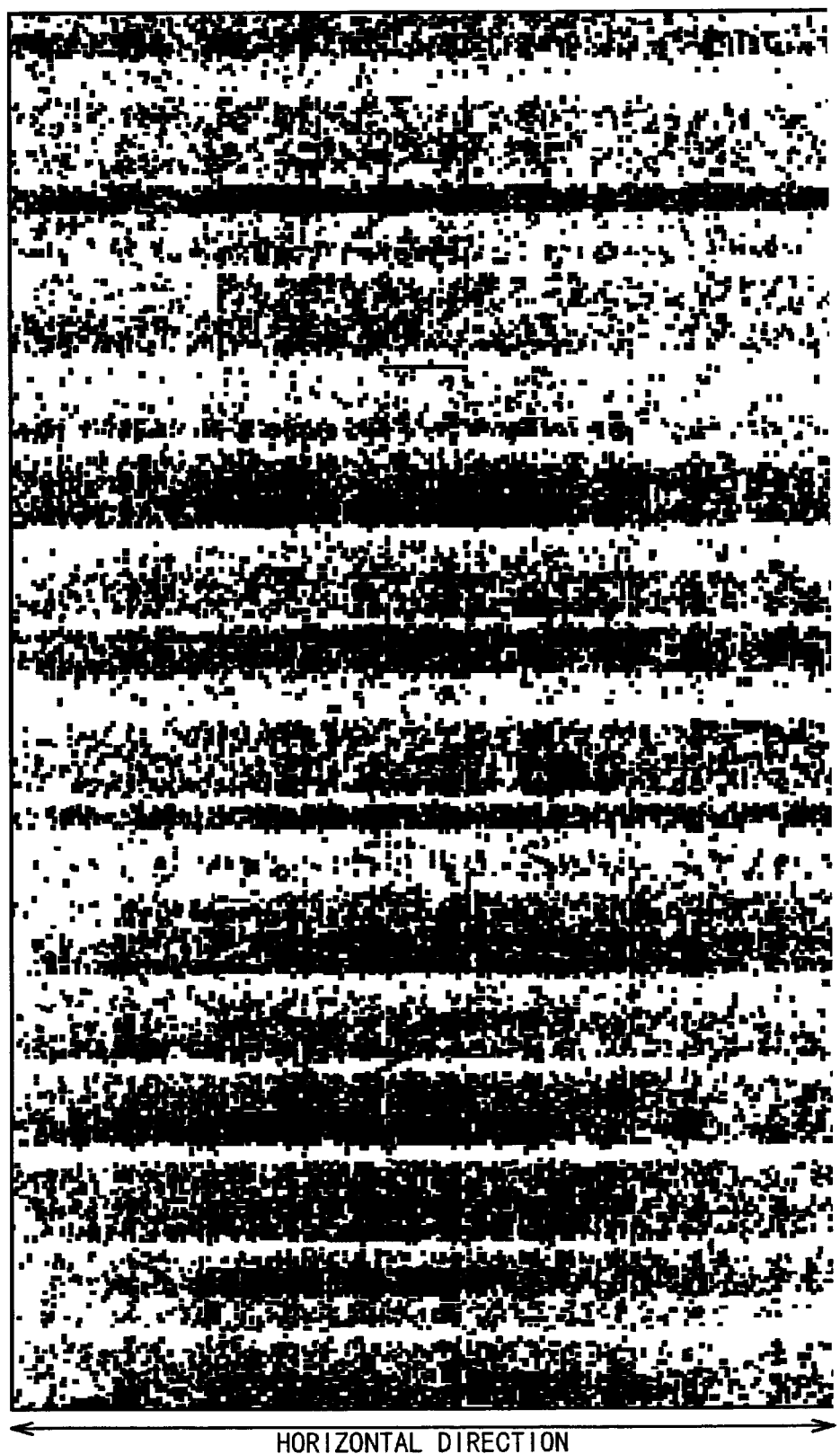
FIG. 4 is a diagram showing an example of the irregular distribution.
Figure 5:
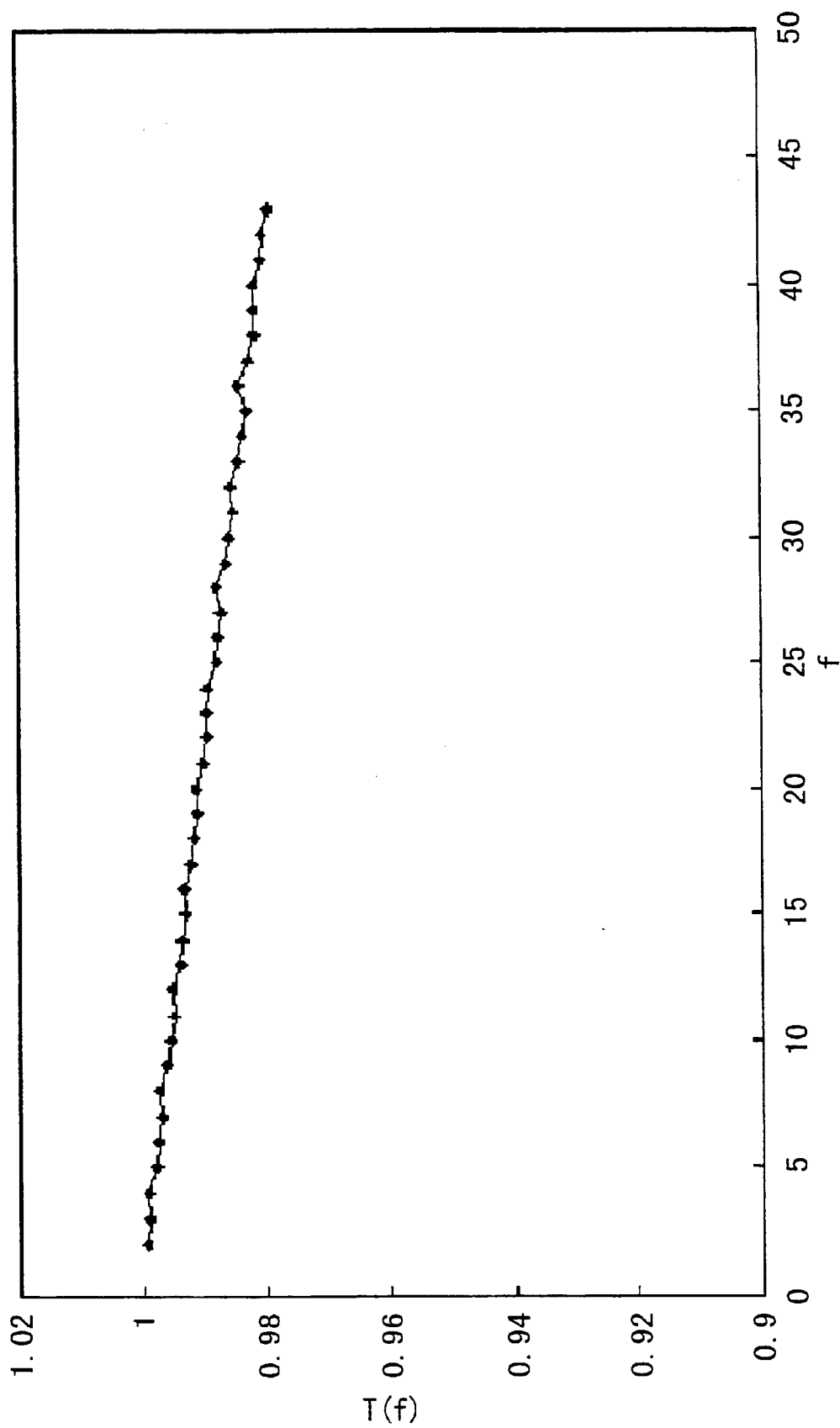
FIG. 5 is a graph showing the analyzing result of the irregular distribution shown in FIG. 4 to the horizontal direction.

FIG. 4 is a graph showing an example of an actual irregular distribution (the number of fault elements is n=37000). It is difficult to visually analyze the fault distribution, because the black points corresponding to the fault elements are irregularly distributed in this graph. FIG. 5 shows a graph showing the analysis result of the irregular distribution shown in FIG. 4 by the calculating unit 2 and the analyzing unit 3. As seen from FIG. 5, the expectation function values T(f) do not exceed "1" for all the divisors f. Therefore, the fact that the fault distribution shown in FIG. 4 is the irregular distribution can be easily distinguished from this result.

As described above, in the fault distribution analyzing system in the first embodiment, the divisors f are found for all the combinations of optional two of the position coordinate intervals |Δx|. Then, the expectation function value T(f) is calculated to each of the divisors f. When all the expectation function values T(f) are equal to or less than "1", the fault element distribution is determined to be an irregular distribution. Therefore, when fault cause candidates are selected from the fault distribution, it is possible to prevent wrong selection by the analysis technical expert. Also, the fault cause candidates can be concisely and quickly selected. In this way, it is possible to easily distinguish whether the fault element distribution is an irregular distribution or contains a regular distribution. For example, the regular distribution is sometimes caused by a wrong design of a semiconductor integrated circuit such as an erroneous wiring and a size error. Also, for example, the irregular distribution is sometimes caused by the manufacturing process of the semiconductor integrated circuit such as alien substance in a process gas, change of a concentration of etching gas and irregularity of a temperature distribution on a wafer.

Also, the position coordinate data of the fault elements is proportional to the number of fault elements. However, the position coordinate data can be converted into the expectation function values T(f) with respect to the divisors f for position coordinate intervals |Δx|. Therefore, the data size can be made small without dependence on the number of fault elements. Thus, the data indicative of the fault tendency can be saved over a long time without limitation of a memory capacity of the analyzing unit.

Second Embodiment

Figure 6:
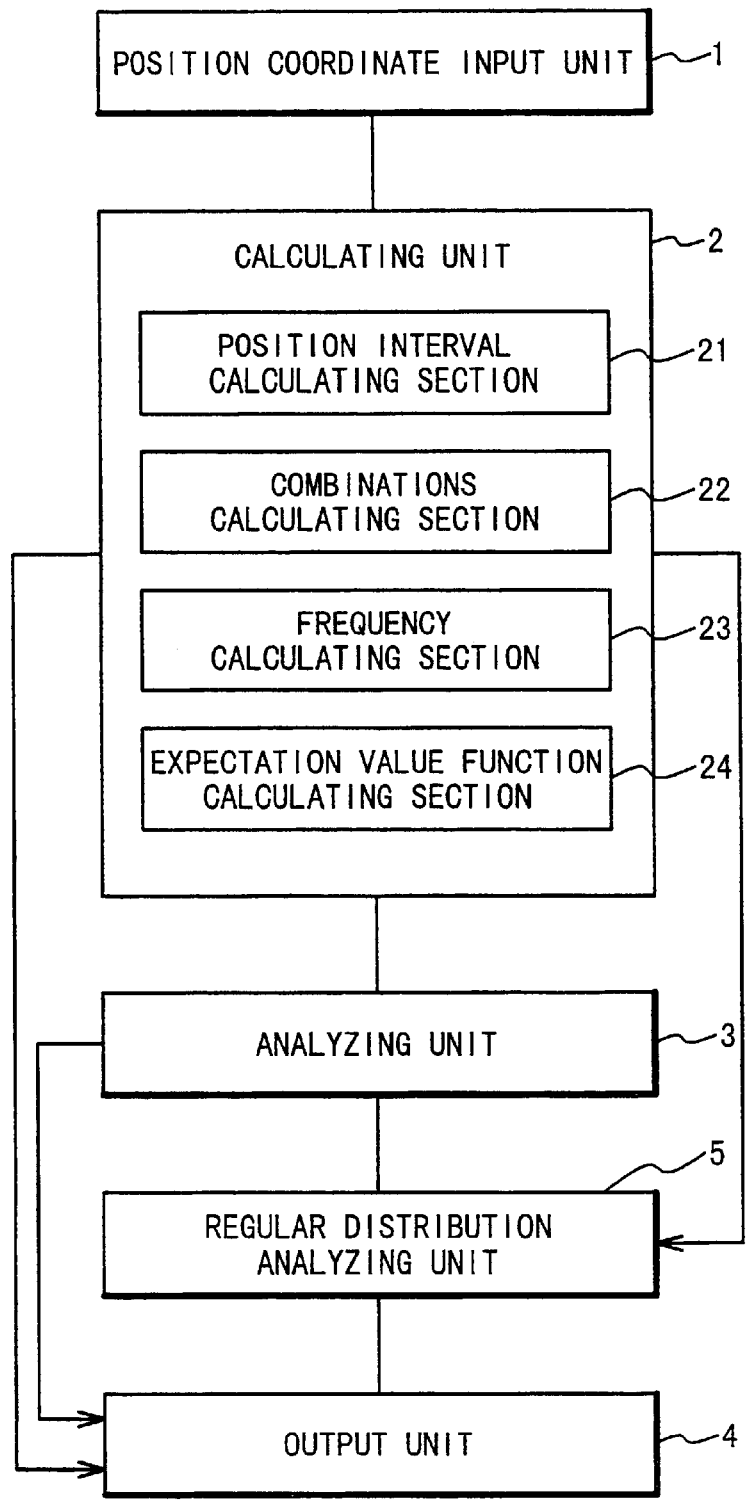
FIG. 6 is a block diagram showing the structure of the fault distribution analyzing system of the semiconductor integrated circuit according to a second embodiment of the present invention.

FIG. 6 is a block diagram showing the structure of the fault distribution analyzing system of the semiconductor integrated circuit according to the second embodiment of the present invention. In this fault distribution analyzing system, a regular distribution analyzing unit 5 is added to the fault distribution analyzing system shown in FIG. 1 in the first embodiment.

When the fault distribution is determined to contain a regular distribution by the analyzing unit 3, the regular distribution analyzing unit 5 analyzes the regular distribution in detail. More specifically, a value of the difference $|\Delta f|_{max}(=|f_{2nd}-f_{1st}|)$ is determined, where $f_{1st}$ is a divisor when the expectation function value T(f) takes a maximum value $T(f)_{1st}$ and $f_{2nd}$ is a divisor when the expectation function value T(f) takes the second largest value $T(f)_{2nd}$. Subsequently, it is determined whether the value of $|\Delta f|_{max}$ is equal to the divisor $f_{1st}$ or is in the permissible range $\delta(T(f)_{1st}>>\delta\geq 0)$. When the value of $|\Delta f|_{max}$ is equal to the divisor $f_{1st}$ or is in the permissible range $\delta(T(f)_{1st}>>\delta\geq 0)$ the regular distribution analyzing unit 5 determines that the fault distribution contains the regular distribution of the period of $\lambda$. The basis of the determination of the period $\lambda$ in such a regular distribution will be described later. Also, in this fault distribution analyzing system, the output unit 4 outputs the analysis result of the regular distribution analyzing unit 5 together with the data in the first embodiment.

It should be noted that the regular distribution analyzing unit 5 may be realized on the same computer as the calculating unit 2 and/or the analyzing unit 3. In this case, the computer executes a program for analysis of the regular distribution, too.

Next, the determination of the period $\lambda$ in the regular distribution will be described in detail. Here, the analysis of the regular distribution is carried out in the range of n=2 to 2048 (x=1 to 2048) and expectation function values T(f) to f=128 is drawn on a graph. Also, a simplified graph is shown to help understanding, depending on the period $\lambda$.

Figure 9:
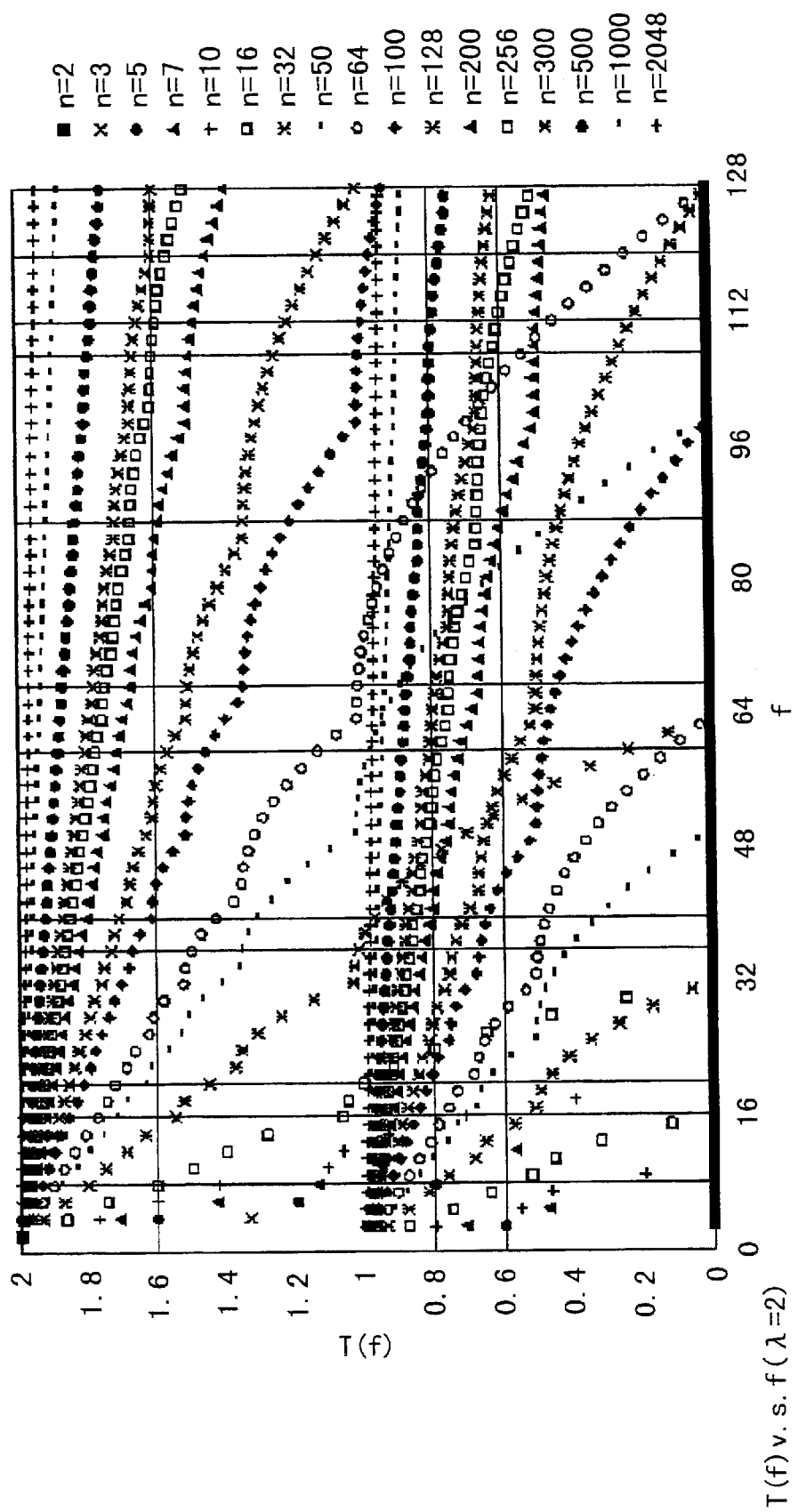
FIG. 9 is a graph showing expectation function values every divisor in a regular distribution having the period of λ=2 in case of determination of the period of the regular distribution.
Figure 10:
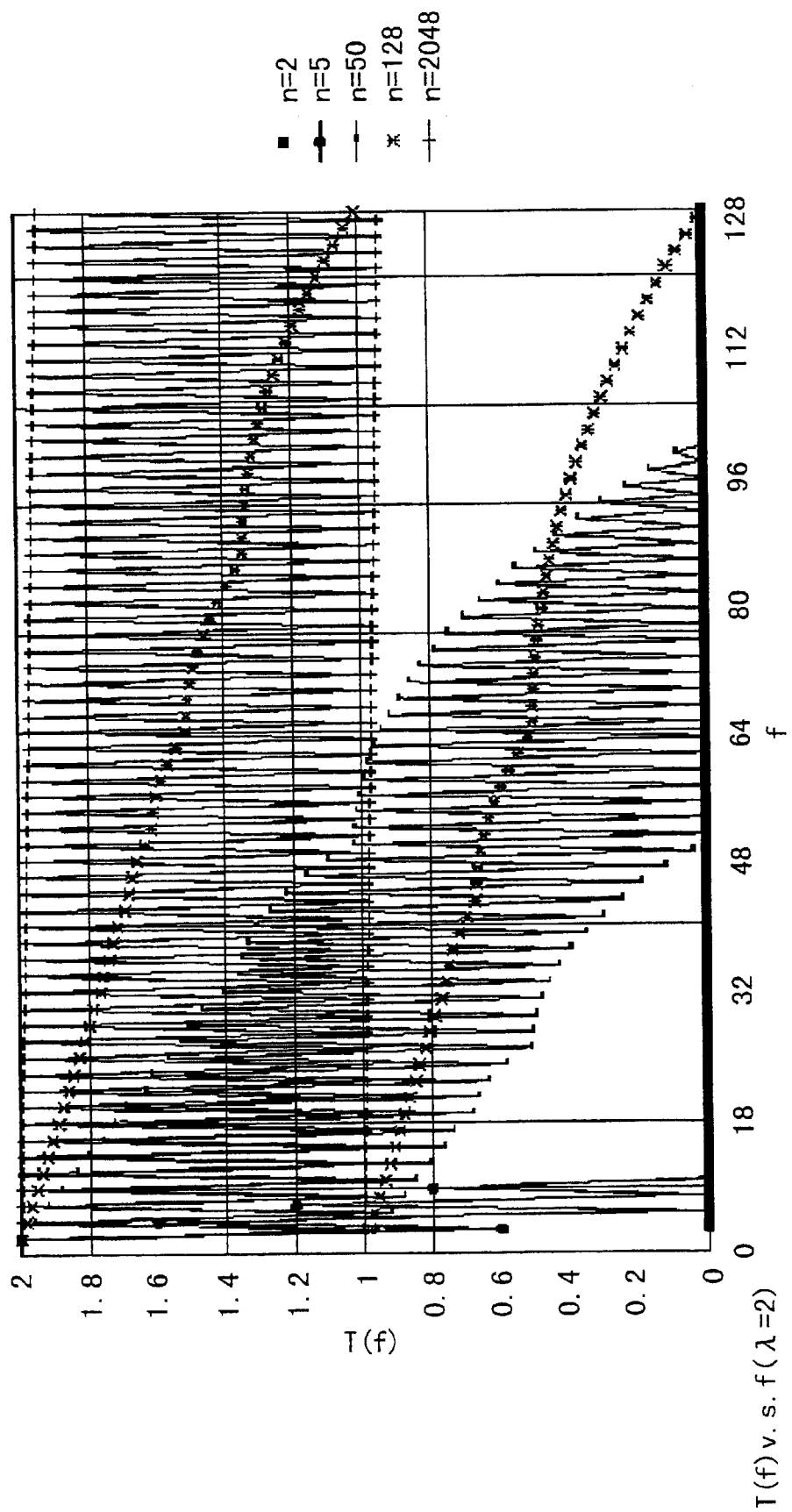
FIG. 10 is a simplified graph of the graph shown in FIG. 9.

A graph of the expectation function values T(f) in the case of the period of $\lambda=2$ is shown in FIG. 9 and a simplified graph is shown in FIG. 10. As seen from FIGS. 9 and 10, the expectation function T(f) increases as the number of fault elements n increases. When a divisor f is not coincident with a multiple of the period $\lambda(=2)$, the expectation function values T(f) are equal to or more than "0", and moreover approaches "1". However, the expectation function values T(f) never exceeds "1". On the other hand, when a divisor f is coincident with the multiple of $\lambda(=2)$, the maximum value $T(f)_{1st}$ of the expectation function values T(f) exceeds "1".

Figure 11:
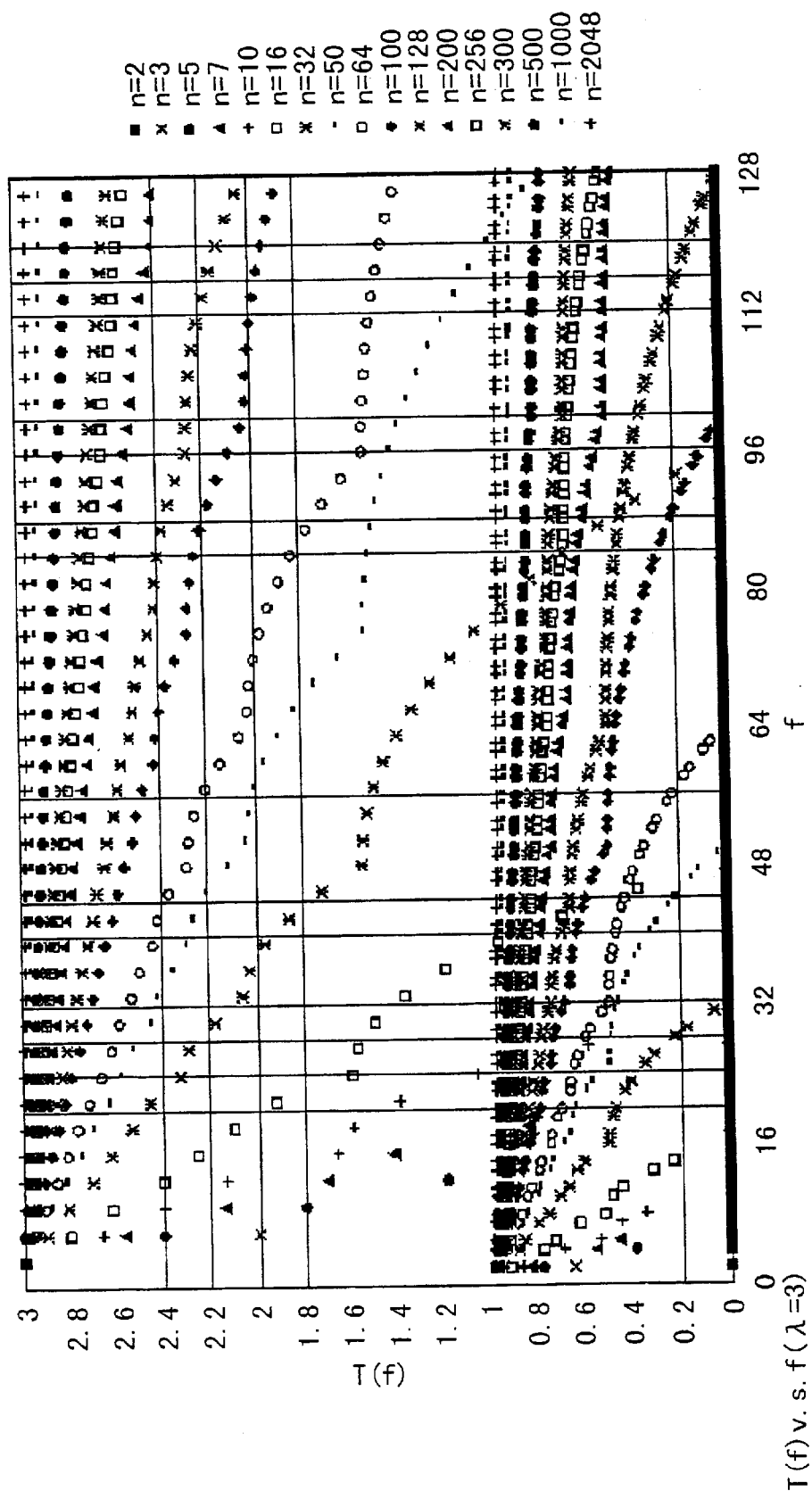
FIG. 11 is a graph showing expectation function values for every divisor in a regular distribution having the period of λ=3 in case of determination of the period of the regular distribution.

In the same way, a graph of the expectation function T(f) in the case of the period of $\lambda=3$ is shown in FIG. 11. As seen from FIG. 11, the expectation function values T(f) approaches from "0" to "1" but never exceeds "1", in the case that the divisor f is other than a multiple of A On the other hand, the maximum value $T(f)_{1st}$ of the expectation function values T(f) exceeds "1", when a divisor f is coincident with a multiple of $\lambda$. Also, the expectation function values T(f) shown in FIGS. 9 and 11 have the maximum values $T(f)_{1st}=\lambda$ at the time of the divisor of $f_{1st}=\lambda$, respectively. Moreover, the expectation function values T(f) have the next largest value $T(f)_{2nd}$ at the time of the divisor of $f_{2nd}=2\lambda$. That is, because $|\Delta f|_{max}=|f_{2nd}-f_{1st}|=|2\lambda-\lambda|=\lambda=T(f)_{1st}$, the fault distribution is determined to contain a regular distribution of the period $\lambda$ having $|\Delta f|_{max}$ as the divisor.

Figure 12:
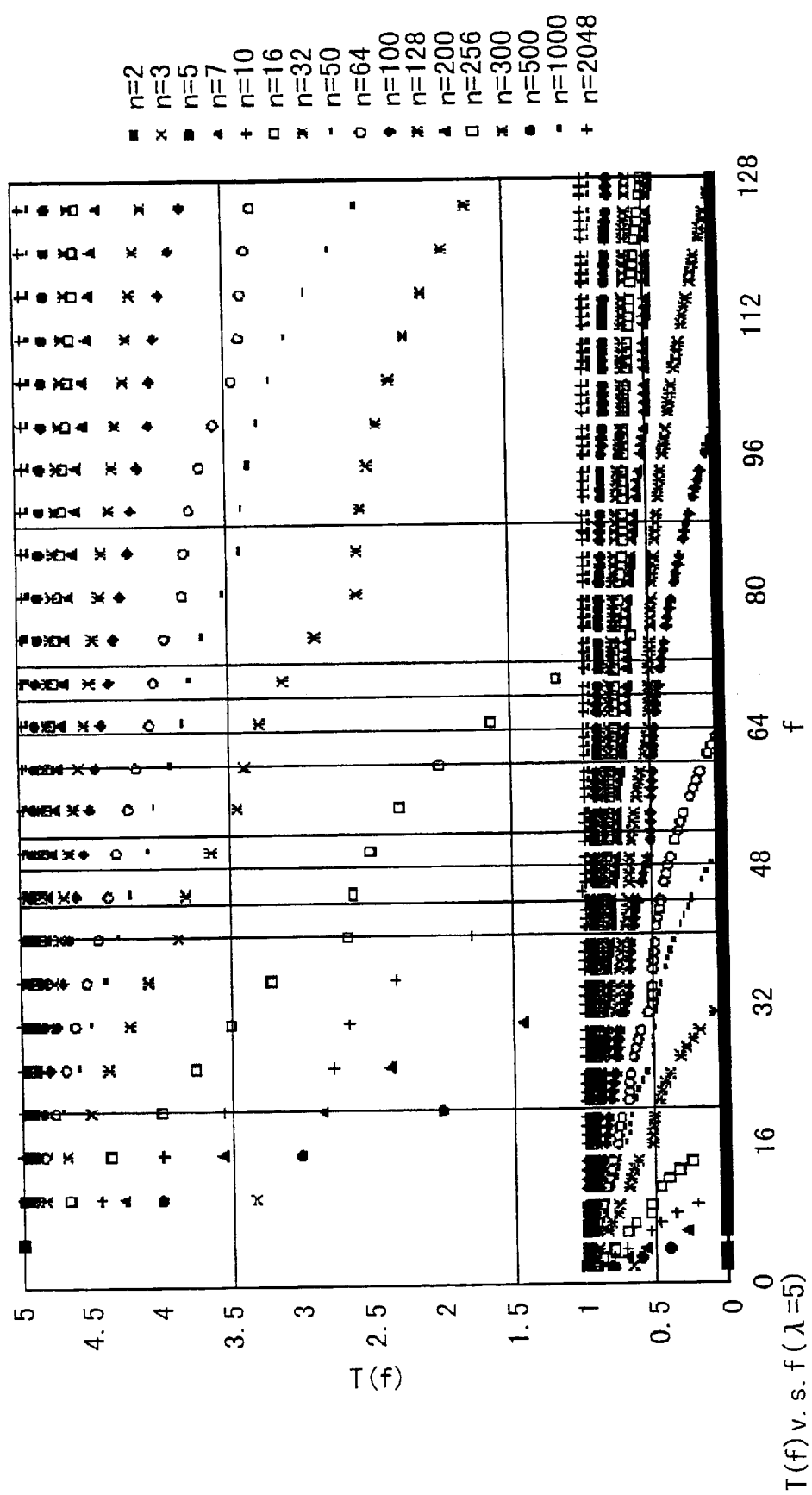
FIG. 12 is a graph showing expectation function values for every divisor in a regular distribution having the period of λ=5 in case of determination of the period of the regular distribution.

In the same way, a graph of the expectation function values T(f) in the case of the period of $\lambda=5$ is shown in FIG. 12. As seen from FIG. 12, the expectation function values T(f) approach from "0" to "1" but never exceed "1", when the divisor f is other than a multiple of $\lambda$. On the other hand, the maximum value $T(f)_{1st}$ of the expectation function values T(f) exceeds "1", when the divisor f is coincident with a multiple of $\lambda$. Also, the expectation function values T(f) shown in FIGS. 9, 11 and 12 have the maximum values $T(f)_{1st}=\lambda$ at the time of the divisor $f_{1st}=\lambda$, respectively. Moreover, the expectation function values T(f) have the next largest value $T(f)_{2nd}$ at the time of the divisor of $f_{2nd}=2\lambda$. That is, because $|\Delta f|_{max}=|f_{2nd}-f_{1st}|=2\lambda-\lambda|=\lambda=T(f)_{1st}$, the fault distribution is determined to contain a regular distribution of the period $\lambda$ having $|\Delta f|_{max}$ as the divisor.

Figure 13:
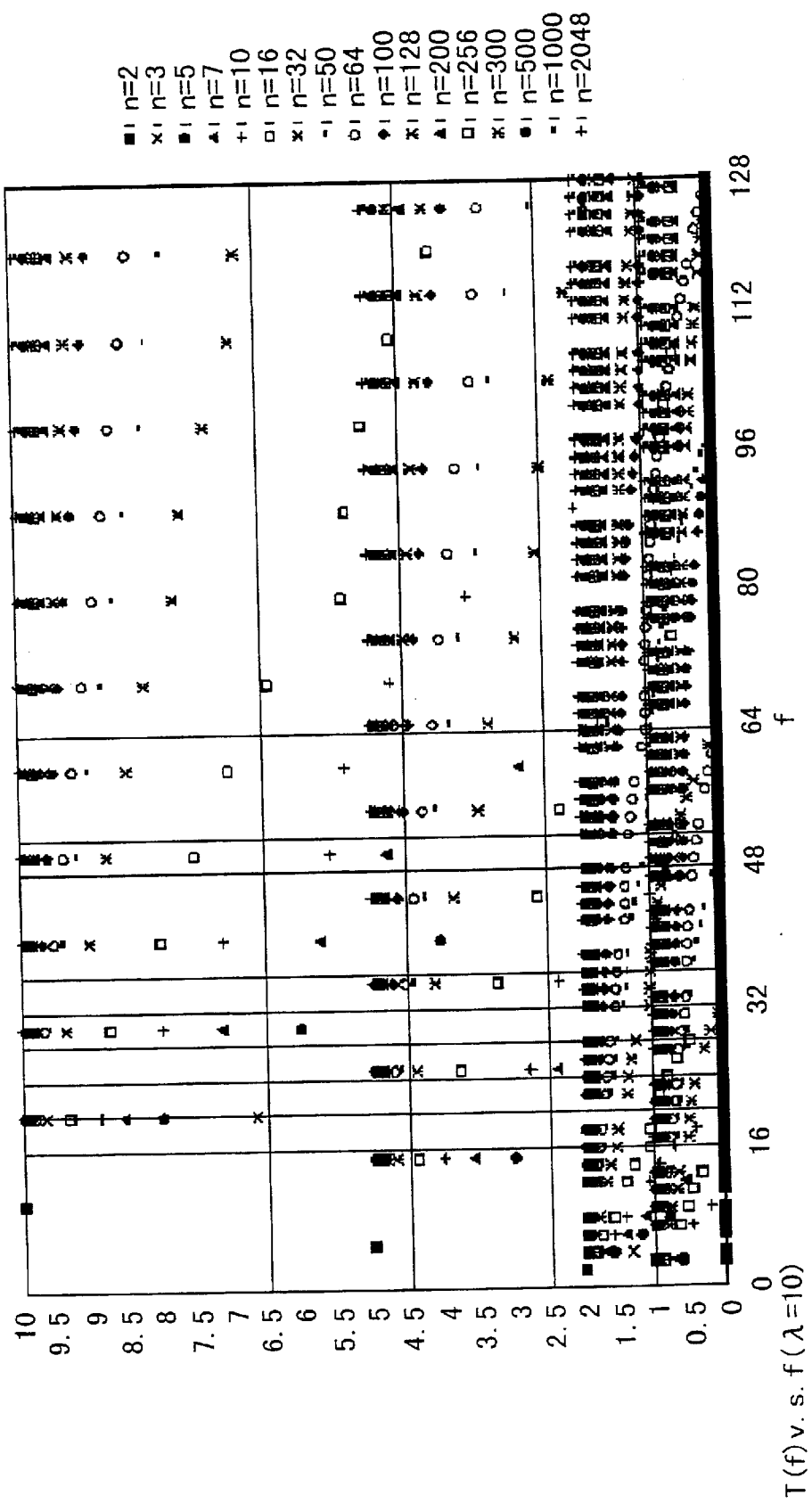
FIG. 13 is a graph showing expectation function values for every divisor in a regular distribution having the period of λ=10 in case of determination of the period of the regular distribution.
Figure 14:
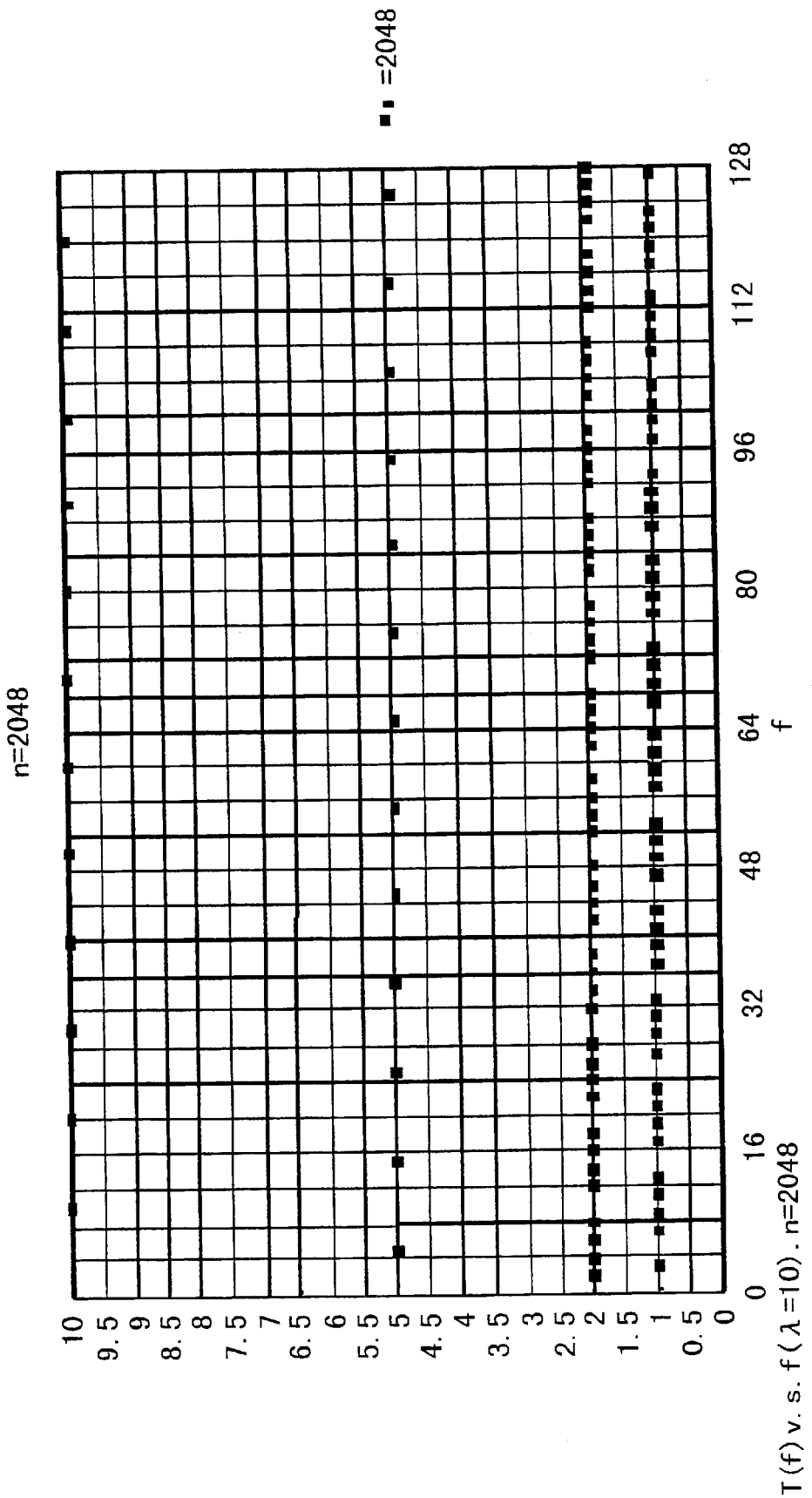
FIG. 14 is a simplified graph of the graph shown in FIG. 13.

Also, a graph of the expectation function values T(f) in the case of the period of $\lambda=10$ is shown in FIG. 13. Also, a simplified graph is shown in FIG. 14. When the period $\lambda$ itself has a divisor as shown in FIGS. 13 and 14, the expectation function values T(f) approach from "0" to "1" but never exceed "1", when the divisor f is other than a multiple of $\lambda(=10)$ and other than a multiple of a divisor(=2 or 5) of the divisor $\lambda$ itself. On the other hand, the maximum value $T(f)_{1st}$ of the expectation function values T(f) exceed "1", when the divisor f is a multiple of the period $\lambda(=10)$ or a multiple of the divisor(=2 or 5) of the divisor $\lambda$ itself. Also, the expectation function values T(f) have the maximum values $T(f)_{1st}=\lambda$ at the time of the divisor of $f_{1st}=10(=\lambda)$. Moreover, the expectation function values T(f) have the next largest values $T(f)_{2nd}$ at the time of the divisor of $f_{2nd}=2\lambda$. Because $|\Delta f|_{max}=|f_{2nd}-f_{1st}|=\lambda=T(f)_{1st}$, the fault distribution is determined to contain a regular distribution of the period of $\lambda=10$ having $|\Delta f|_{max}$ as the divisor.

Figure 15:
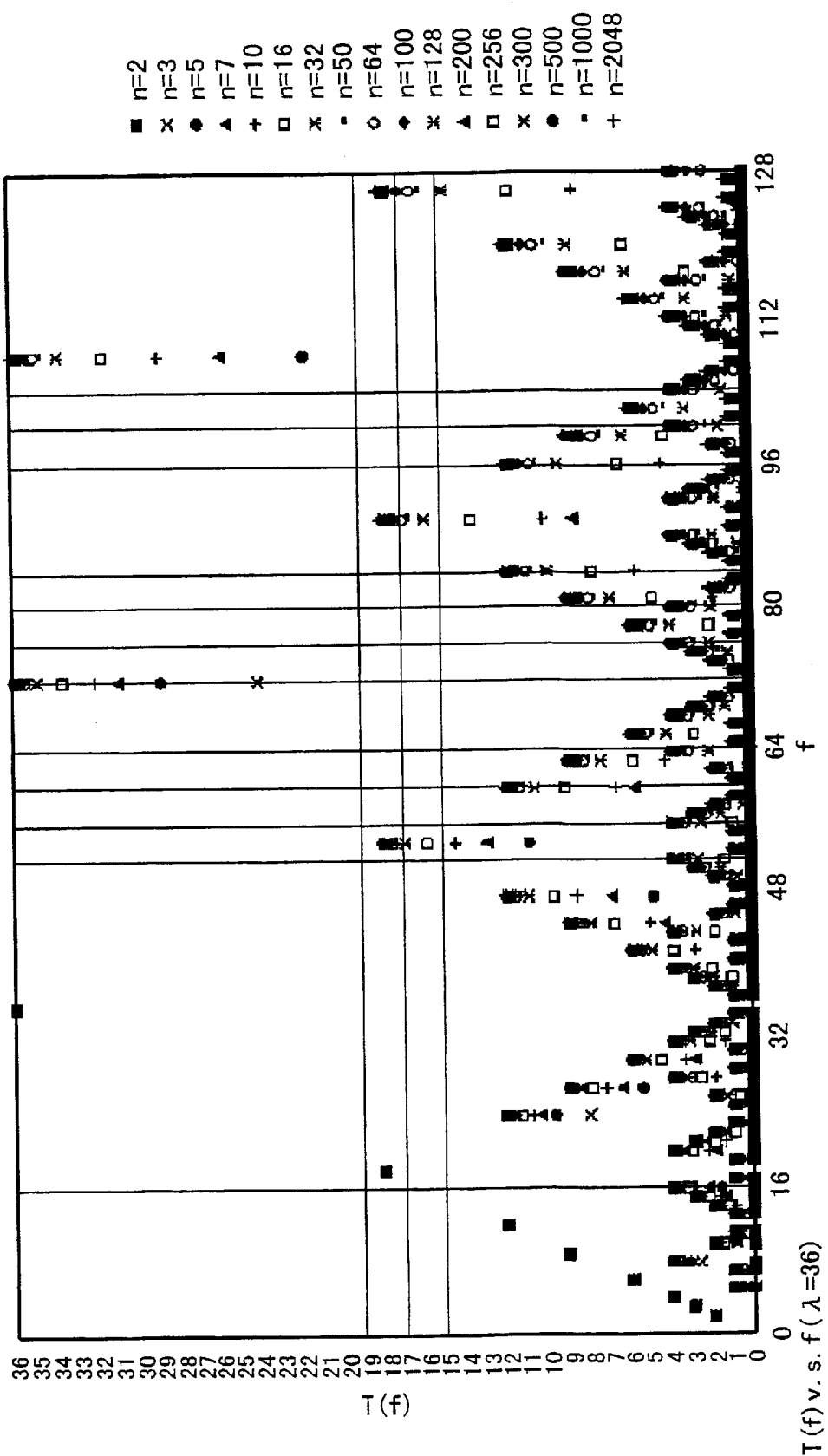
FIG. 15 is a graph showing expectation function values for every divisor in a regular distribution having the period of λ=36 in case of determination of the period of the regular distribution.
Figure 16:
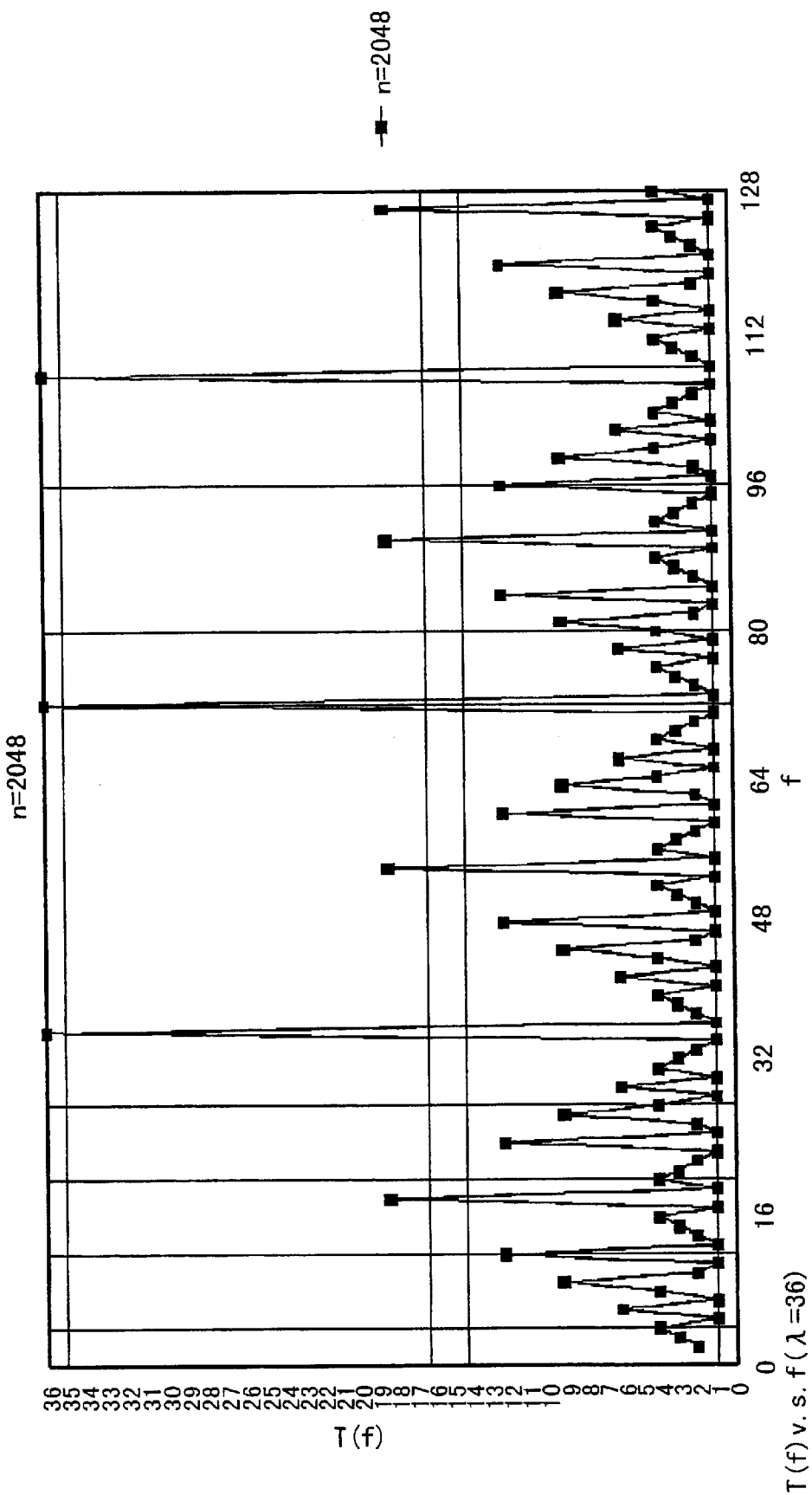
FIG. 16 is a simplified graph of the graph shown in FIG. 15.

Also, a graph of the expectation function values T(f) in the case of the period of $\lambda=36$ is shown in FIG. 15. Also, a simplified graph is shown in FIG. 16. As seen from FIGS. 15 and 16, the expectation function values T(f) approach from "0" to "1" but never exceed "1", when the divisor f is other than a multiple of the period $\lambda(=36)$ and is other than a multiple of a divisor(=2, 3, 4, 6, 9, 12 and 18) of the divisor $\lambda$ itself. On the other hand, the maximum value $T(f)_{1st}$ of the expectation function values T(f) exceeds "1", when the divisor f is a multiple of the period $\lambda(=36)$ or the multiple of a divisor(=2, 3, 4, 6, 9, 12 and 18) of the period $\lambda$ itself. Also, the expectation function values T(f) have the maximum value $T(f)_{1st}=\lambda$ at the time of the divisor of $f=36(=\lambda)$ and moreover have the second largest value of $T(f)_{2nd}$ at the time of the divisor of $f_{2nd}=2\lambda$. Because $|\Delta f|_{max}=|f_{2nd}-f_{1st}|=\lambda=T(f)_{1st}$, the fault distribution is determined to contain a regular distribution of the period of $\lambda=36$ having $|\Delta f|_{max}$ as the divisor.

As the conclusion, when the fault element distribution contains a regular distribution of the period $\lambda$ of only one kind, the difference $|\Delta f|_{max}$ between the divisor of $f_{1st}$ when the expectation function values T(f) have the maximum value of $T(f)_{1st}$ exceeding "1" and the divisor of $f_{2nd}$ when the expectation function values T(f) have the second largest value of $T(f)_{2nd}$ is equal to the divisor of the period $\lambda$ including the period $\lambda$ itself, with no relation to the number of combinations n of the intervals between the fault elements and the kind of the period $\lambda$.

Figure 7:
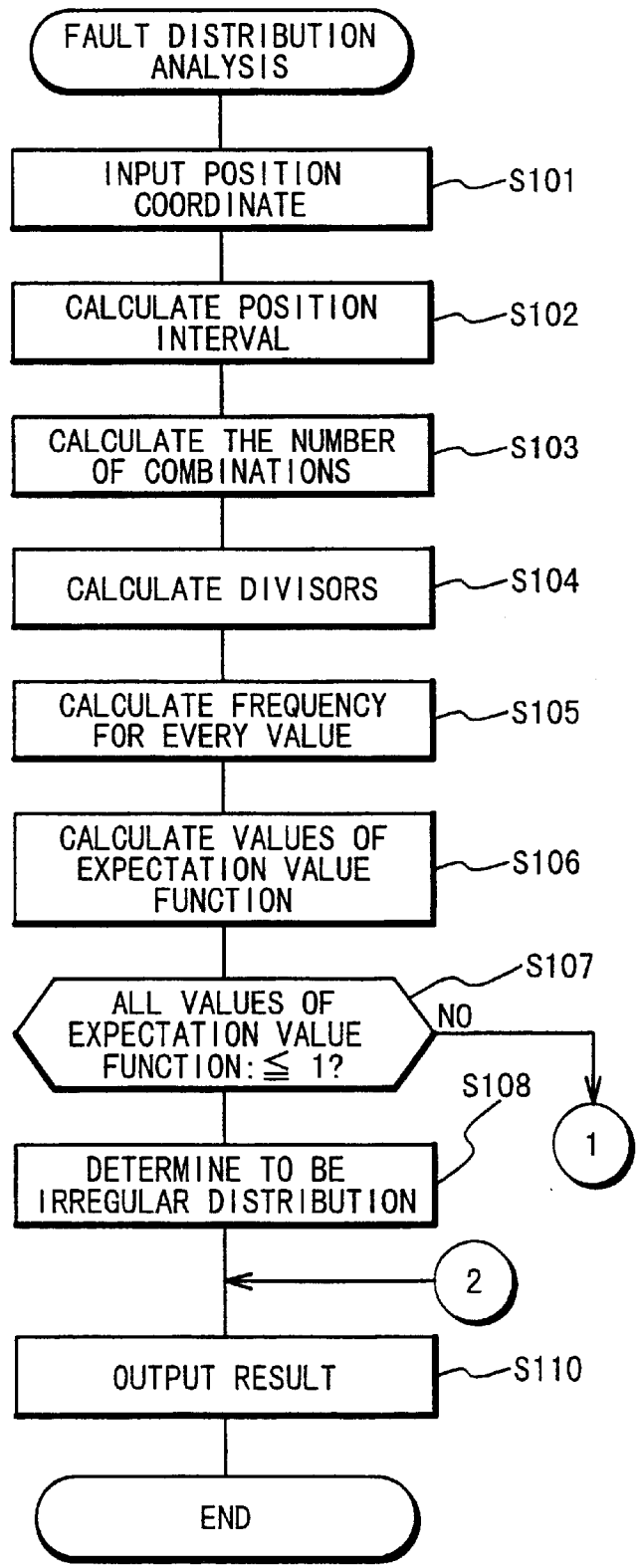
FIGS. 7 and 8 are flow charts showing the process of the fault distribution analyzing system according to the second embodiment of the present invention.
Figure 8:
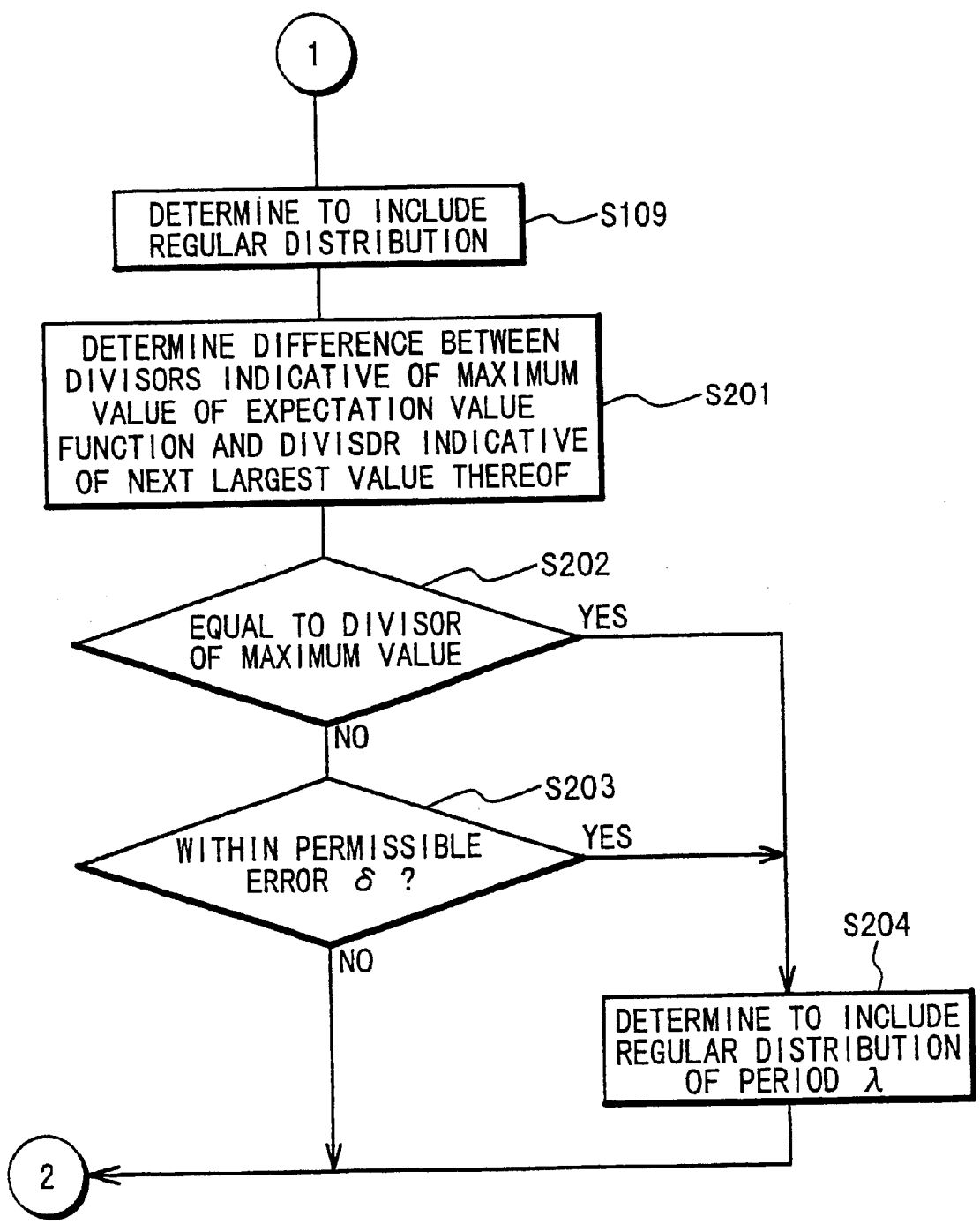

Hereinafter, the processing operation of the fault distribution analyzing system of the semiconductor integrated circuit according to the second embodiment will be described with reference to a flow chart shown in FIGS. 7 and 8.

Figure 2:
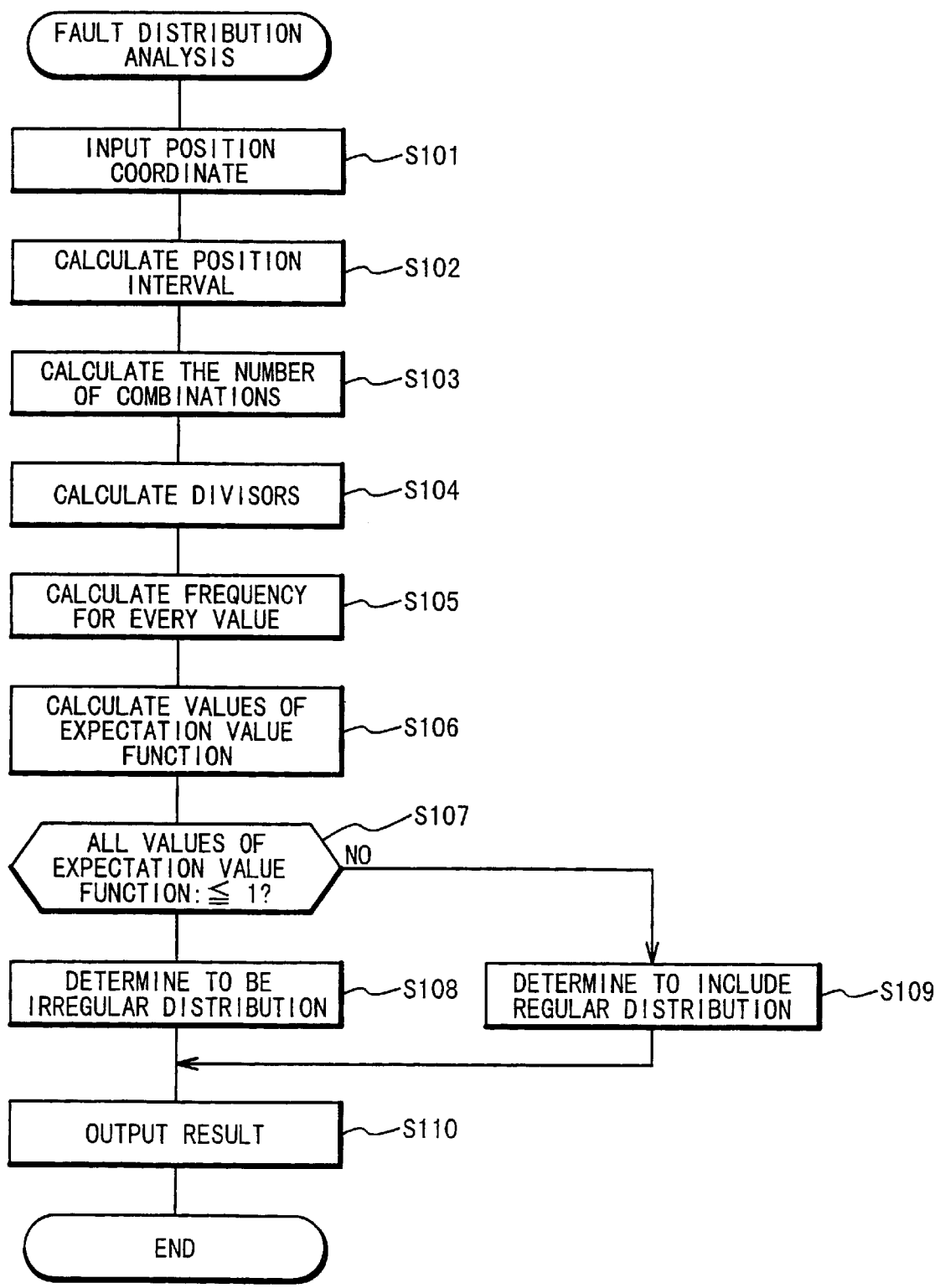
FIG. 2 is a flow chart showing a process executed by the fault distribution analyzing system according to the first embodiment of the present invention.

The processing operation of the fault distribution analyzing system in the second embodiment is different from that of the fault distribution analyzing system shown in FIG. 2 in the first embodiment in that the processing operation when it is determined at the step S107 that either of the expectation function values T(f) exceeds "1", and it is determined at the step S109 that the fault distribution contains a regular distribution. Also, the calculation result by the expectation value function calculating section 24 at the step S106 is transferred from the calculating unit 2 to the regular distribution analyzing unit 5.

When the fault distribution is determined at the step S109 to contain the regular distribution, the regular distribution analyzing unit 5 determines the value of difference $|\Delta f|_{max}$ ($=|f_{2nd}-f_{1st}|$) between the divisor of $f_{1st}$ when the expectation function values T(f) transferred from the calculating unit 2 have the maximum value of $T(f)_{1st}$ and the divisor $f_{2nd}$ when the expectation function values T(f) have the second largest value of $T(f)_{2nd}$ (Step S201).

Next, the regular distribution analyzing unit 5 determines whether or not the value of difference $|\Delta f|_{max}$ is equal to the divisor of $f_{1st}$ (Step S202). When it is determined that the value of difference $|\Delta f|_{max}$ is equal to the divisor of $f_{1st}$, the regular distribution analyzing unit 5 executes the processing of a step S204 to be described later.

On the other hand, when it is determined that the value of difference $|\Delta f|_{max}$ is not equal to the divisor of $f_{1st}$ the regular distribution analyzing unit 5 determines whether or not the value of difference $|\Delta f|_{max}$ is in the permissive range $\delta(T(f) 1st>>\delta \geq 0)$ (Step S203). When it is determined that the value of difference $|\Delta f|_{max}$ is not in the permissive range $\delta$, the control advances to a step S110. At the step S110, the analysis result at the step S109 from the analyzing unit 3 is outputted from the output unit 4, as in the case of the first embodiment.

Also, when it is determined that the value of difference $|\Delta f|_{max}$ is in the permissive range $\delta$, the control advances to a step S204. At the step S204, the regular distribution analyzing unit 5 determines that a regular distribution of the period of $\lambda$ is contained in the distribution of fault elements, and transfers the determination result to the output unit 4 as the analysis result. In this case, the output unit 4 outputs the analysis result at the step S109 from the regular distribution analyzing unit 5 together with the above-mentioned data.

Hereinafter, what analysis result is obtained from the position coordinates of the fault element distribution which has been inputted from position coordinate inputting unit 1 in this fault distribution analyzing system will be described in detail based on an example.

EXAMPLE 2-1

In this example, it is supposed that the number of fault elements in a semiconductor integrated circuit n=5 and the position coordinate of each fault element in the specific direction is (x)=(1), (3), (5), (7) and (9).

① The Calculation of the Position Coordinate Intervals $|\Delta x|$ (Step S102)

In this example, the following combinations are possible:

x=3, 5, 7 and 9 to coordinate x=1;
x=5, 7 and 9 to coordinate x=3;
x=7 and 9 to coordinate x=5; and
x=9 to coordinate x=7.

Therefore, the position coordinate intervals $|\Delta x|$ between optional two of the fault elements are as follows:

$|\Delta x| = |3-1|, |5-1|, |7-1|, |9-1|, |5-3|, |7-3|, |9-3|, |7-5|$
and $|9-5|$
$= 2, 4, 6, 8, 2, 4, 6, 2, 4$ and $2$ Also, the number of combinations N is:

$N = {}_nC_2$
$= n(n-1)/2$
$= 5(5-1)/2$
$= 10$

② The Calculation of the Number of Combinations Nx (Step S103)

Because all the position coordinate intervals $|\Delta x|$ is larger than "0", the number of combinations with $\Delta x|=0$ is ux=0 in this example. Therefore, $Nx = N - ux$
$= 10 - 0$
$= 10.$ ③ The Calculation of Divisors f (Step S104)

The divisors f which are equal to or more than "2" are determined as follow for each of the position coordinate intervals $|\Delta x|$:

the divisor f is 2 to $|\Delta x|=2$;
the divisor f is 2 and 4 to $|\Delta x|=4$;
the divisors f are 2, 3 and 6 to $|\Delta x|=6$;
the divisors f are 2, 4 and 8 to $|\Delta x|=8$;
the divisor f is 2 to $|\Delta x|=2$;
the divisors f are 2 and 4 to $|\Delta x|=4$;
the divisors f are 2, 3 and 6 to $|\Delta x|=6$;
the divisor f is 2 to $|\Delta x|=2$;
the divisors f are 2 and 4 to $|\Delta x|=4$; and
the divisor f is 2 to $|\Delta x|=2$.

④ The Calculation of Divisor Depending Frequency $\Sigma m(f)$ (Step S105)

The divisor depending frequency $\Sigma m(f)$ to each of the divisors f determined mentioned above is calculated as follows:

$\Sigma m(2)=10$;
$\Sigma m(3)=2$;
$\Sigma m(4)=4$;
$\Sigma m(5)=0$;
$\Sigma m(6)=2$;
$\Sigma m(7)=0$;

and $\Sigma m(8)=1$.

⑤ The Calculation of Expectation Function Values T(f) (Step S106).

The appearance probability P(f) of each of the above-mentioned divisors f is as follows:

$P(2)=10/10;$ $P(3)=2/10;$ $P(4)=4/10;$ $P(5)=0/10;$ $P(6)=2/10;$ $P(7)=0/10;$ and
ti $P(8)=1/10$.

Therefore, the expectation function values T(f) to the divisors f are:

$T(2)=2\times10/14=20.;$ $T(3)=3\times2/10=0.6;$ $T(4)=4\times4/10=1.6;$ $T(5)=5\times0/10=0.0;$ $T(6)=6\times2/10=1.2;$ $T(7)=7\times0/10=0.0;$ and $T(8)=8\times1/10=0.8.$ ⑥ The Analysis of the Fault Distribution (Step S107 to S109)

In this example, the expectation function values T(f) to each of the divisors f(=2, 4 and 6) exceed "1". Therefore, in this example, the fault distribution is determined to be a regular distribution. As described above, in this example, since the fault distribution is determined to be an irregular distribution, the regular distribution is analyzed by the regular distribution analyzing unit 5.

⑦ The Calculation of $|\Delta f|_{max}$ (Step S201)

In this example, the divisor $f_{1st}$ corresponding to the largest expectation function value T(f) is "2" and the divisor $f_{2nd}$ corresponding to the next largest expectation function value T(f) is "4". Therefore, $|\Delta f|_{max}=|4-2|=2$ ⑧ The Analysis of the Regular Distribution (S202–S204)

As described above, the value of $|\Delta f|_{max}$ is "2" and is equal to the value of "2" of the divisor $f_{1st}$ when the expectation function values T(f) have the maximum. Therefore, the fault distribution is determined to contain a regular distribution of the period λ in this example.

Next, the fault distribution analyzing system in the second embodiment will be described based on the actually obtained data.

Figure 17:
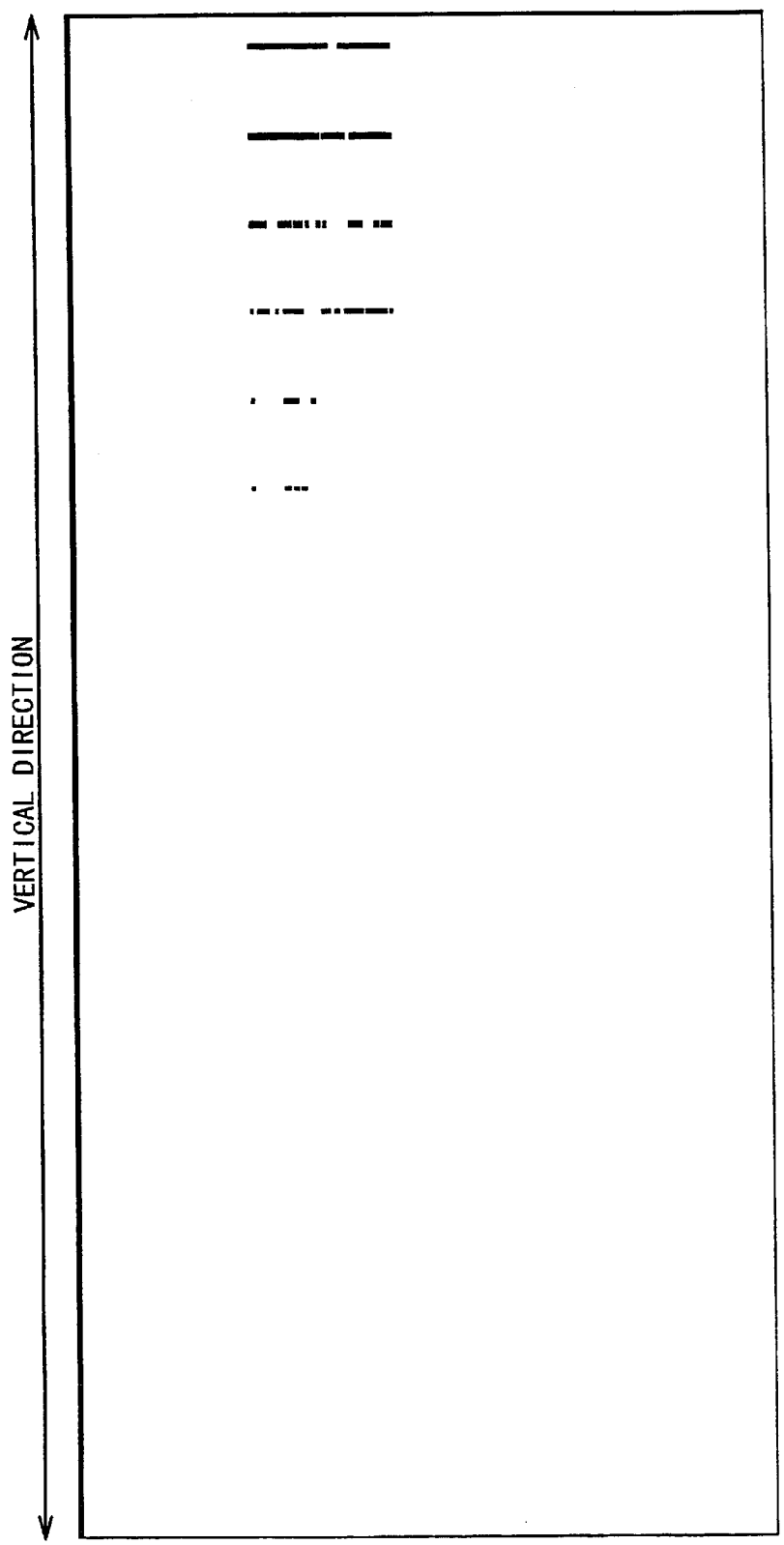
FIG. 17 is a diagram showing an example containing a regular distribution.

FIG. 17 is an image showing an actual example containing the regular distribution (the number of fault elements is n=1000). It could be seen that the black points corresponding to the fault elements are regularly distributed. However, the period must be examined in detail.

Figure 18:
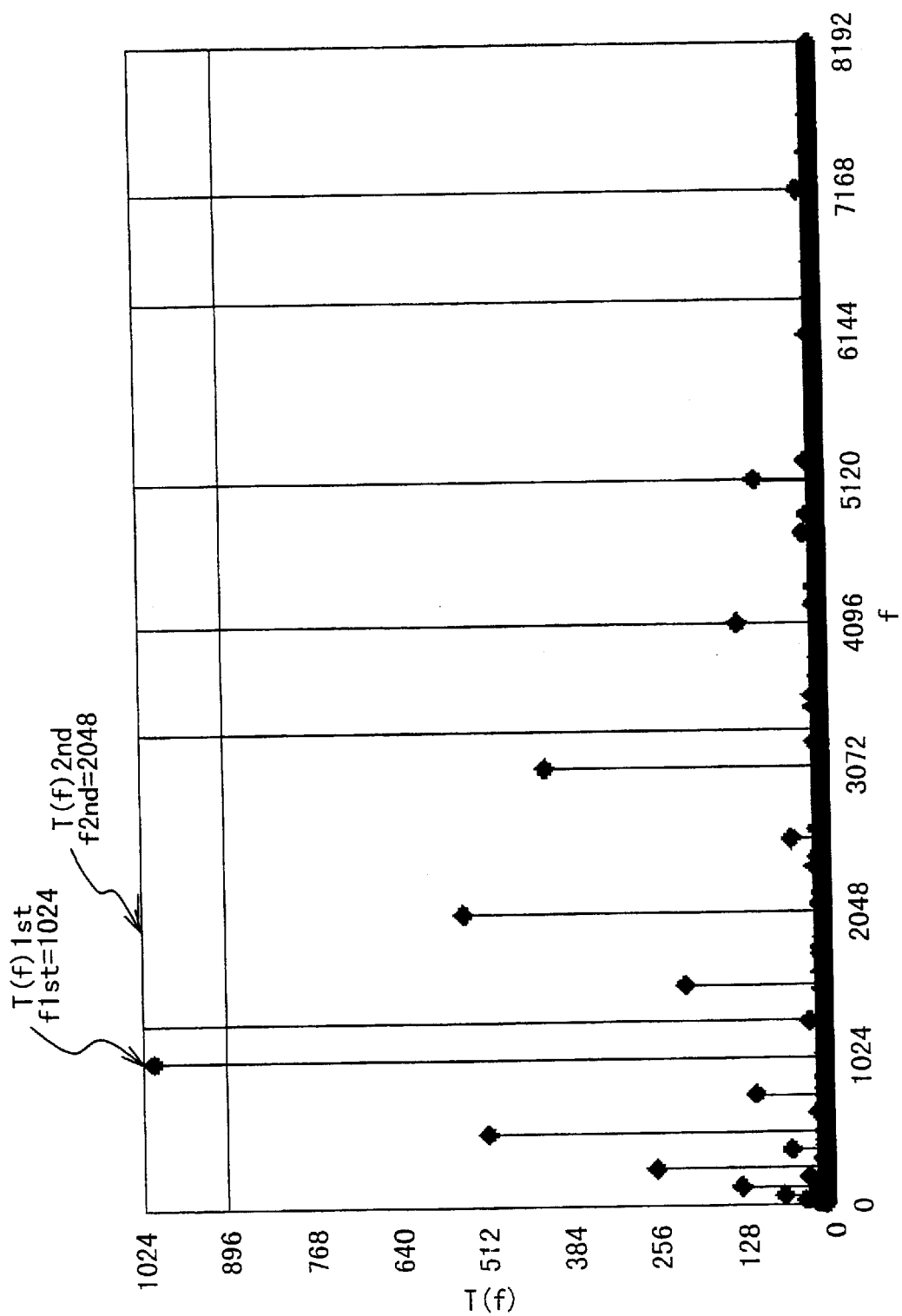
FIG. 18 is a graph showing the analyzing result of a period in case of the regular distribution shown in FIG. 17 in the vertical direction.

FIG. 18 shows a graph of the analyzing result of the regular distribution shown in FIG. 17 by the regular distribution analyzing unit 5. As seen from FIG. 18, the divisor $f_{1st}$ when the expectation function T(f) has the maximum is "1024" and the divisor $f_{2nd}$ when the expectation function T(f) has the second largest value is "2048". Therefore, $$|\Delta f|_{max} = |f_{2nd} - f_{1st}|$$
$$|2048 - 1024|$$
$$= 1024$$

Thus, it is possible to determine that the fault distribution contains a regular distribution of the period of λ=1024.

In this way, when the fault distribution contains an irregular distribution and the regular distributions of the different periods, the main periods of regular distributions can be detected.

As described above, in the fault distribution analyzing system in the second embodiment, the period λ of the regular distribution is determined based on the difference of the divisor $f_{1st}$ when the expectation function T(f) has the largest value $T(f)_{1st}$ and the divisor $f_{2nd}$ when the expectation function T(f) has the second largest value $T(f)_{2nd}$, i.e., $|f_{2nd}-f_{1st}|$. Therefore, when the fault distribution is determined to contain a regular distribution, the period λ can be easily and quickly found.

Third Embodiment

Figure 19:
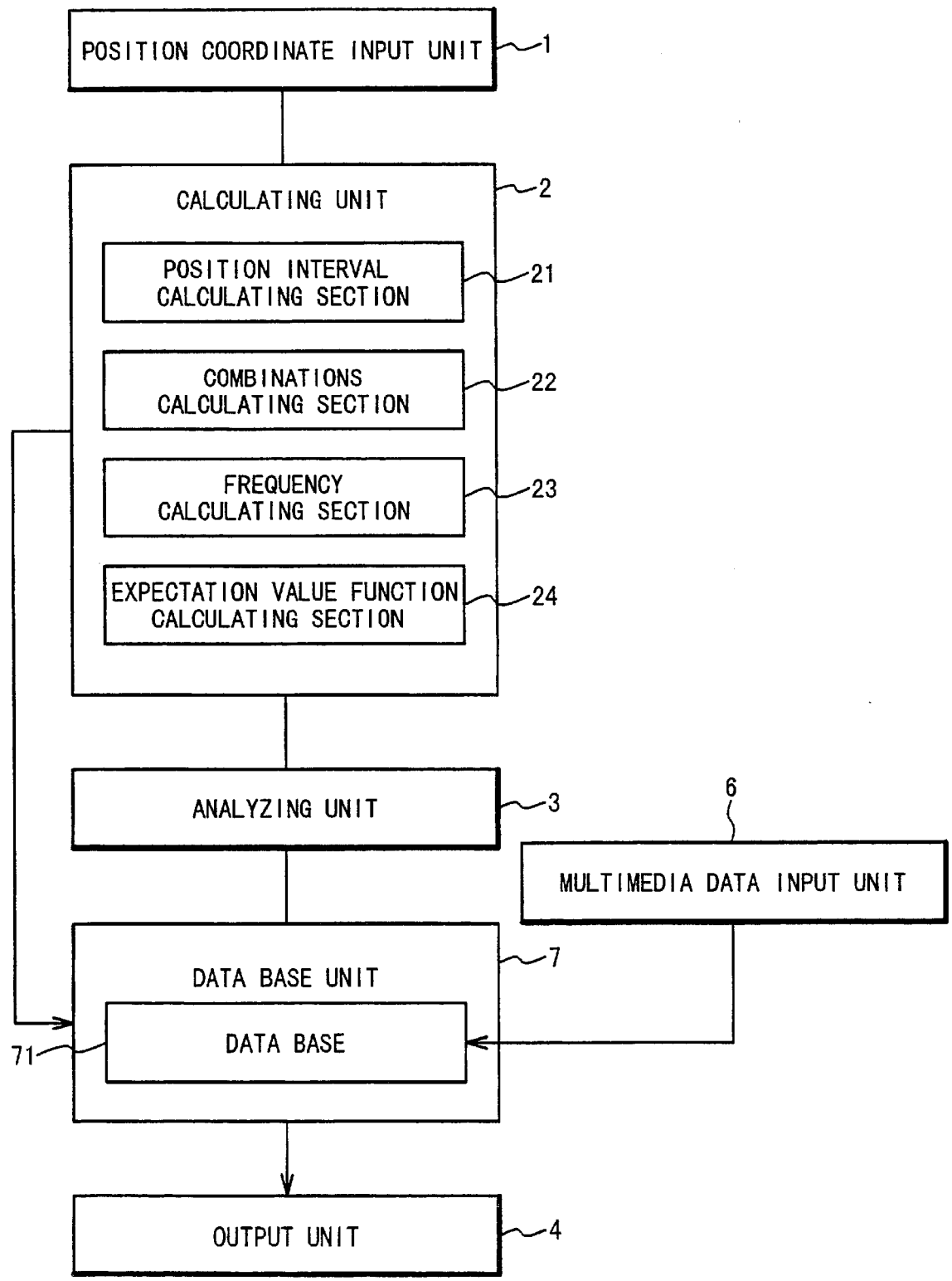
FIG. 19 is a block diagram showing the structure of the fault distribution analyzing system of the semiconductor integrated circuit according to a third embodiment of the present invention.

FIG. 19 is a block diagram showing the structure of the fault distribution analyzing system of the semiconductor integrated circuit according to the third embodiment. In the fault distribution analyzing system, a multimedia data entry unit 6 and a data base unit 7 are added to the fault distribution analyzing system shown in FIG. 1 in the first embodiment.

The multimedia data entry unit 6 inputs an image showing an analysis object, i.e., a distribution of fault elements which are contained in a semiconductor integrated circuit and whose position coordinates x are inputted from the position coordinate inputting unit 1, and transfers to the data base unit 7. The image includes a diagram. It should be noted that there can be used as the multimedia data entry unit 6, a computer for drawing the diagram in which the position coordinates of the fault elements are plotted, a scanner unit for imaging a photograph of the semiconductor integrated circuit as the analysis object and a video unit for producing a static image of the whole semiconductor integrated circuit from a picture of the semiconductor integrated circuit.

The data base unit 7 registers the image showing the fault distribution of the semiconductor integrated circuit which has been inputted from the multimedia data entry unit 6 to a data base 71 built on an auxiliary storage. Also, the data base unit 7 registers a set of the expectation function values T(f) and divisors f as a data unit on the data base 71 in correspondence with the image showing the previously registered fault distribution of the semiconductor integrated circuit, when the expectation function values T(f) exceeding "1" is determined to be contained by the analyzing unit 3. Also, the data base unit 3 acquires a date and a time when the set of the expectation function values T(f) are registered on the data base 71 with respect to the divisors f and registers an identifier data which contains the acquired date and time, on the data base unit 71 in the correspondence to the set of the expectation function values T(f).

When a divisor f is inputted from the inputting unit such a keyboard, the data base unit 7 searches the data base 71 based on the inputted the divisor f to acquire the corresponding identifier data, the set of the expectation function value and the corresponding image showing the fault distribution. Then, the data base unit 7 transfers the searched data to the output unit 4.

In the third embodiment, the output unit 4 outputs the calculation result of the calculating unit 2 and the analysis result of the analyzing unit 3. In addition, the output unit 4 sorts the transferred data searched by and transferred from the data base unit 7 based on the data indicative of date and time contained in the identifier data which is contained in the searched data. Also, the calculation result of the calculating unit 2 and the analysis result of the analyzing unit 3 are transferred to the data base unit 7.

It should be noted that the data base unit 7 may be realized on the computer for the calculating unit 2 and/or the analyzing unit 3. In this case, the computer executes a data base program corresponding to the processing described above, and a data base is produced on a storage unit of the computer.

Hereinafter, the processing of the fault distribution analyzing system of the semiconductor integrated circuit according to the third embodiment will be described with reference to the flow chart shown in FIGS. 20 and 21. In this case, an image showing the distribution of fault elements contained in the semiconductor integrated circuit as an analysis object is previously registered on the data base 71 by the data base unit 7 prior to the processing of the flow chart shown in FIGS. 20 and 21.

Figure 20:
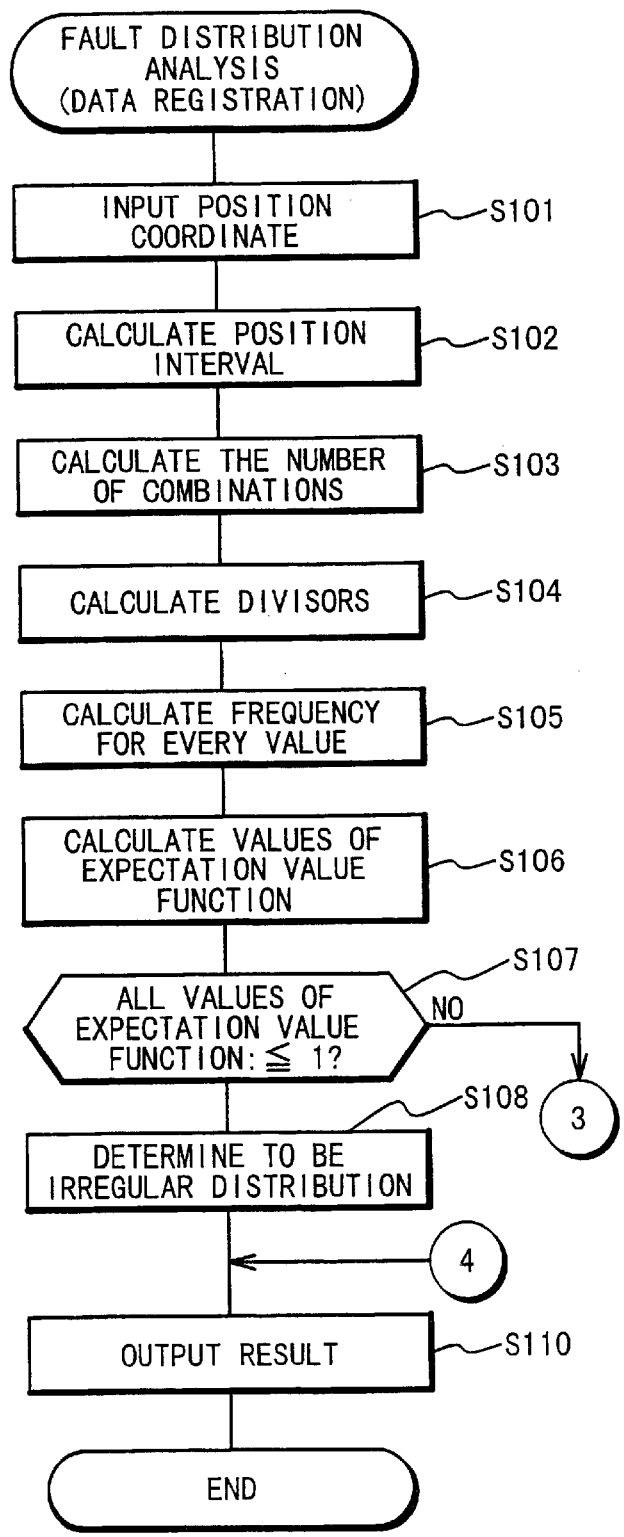
FIGS. 20 and 21 are flow charts showing a data registering process of and outputting process of an analyzing result of the fault distribution analyzing system according to the third embodiment of the present invention.
Figure 21:
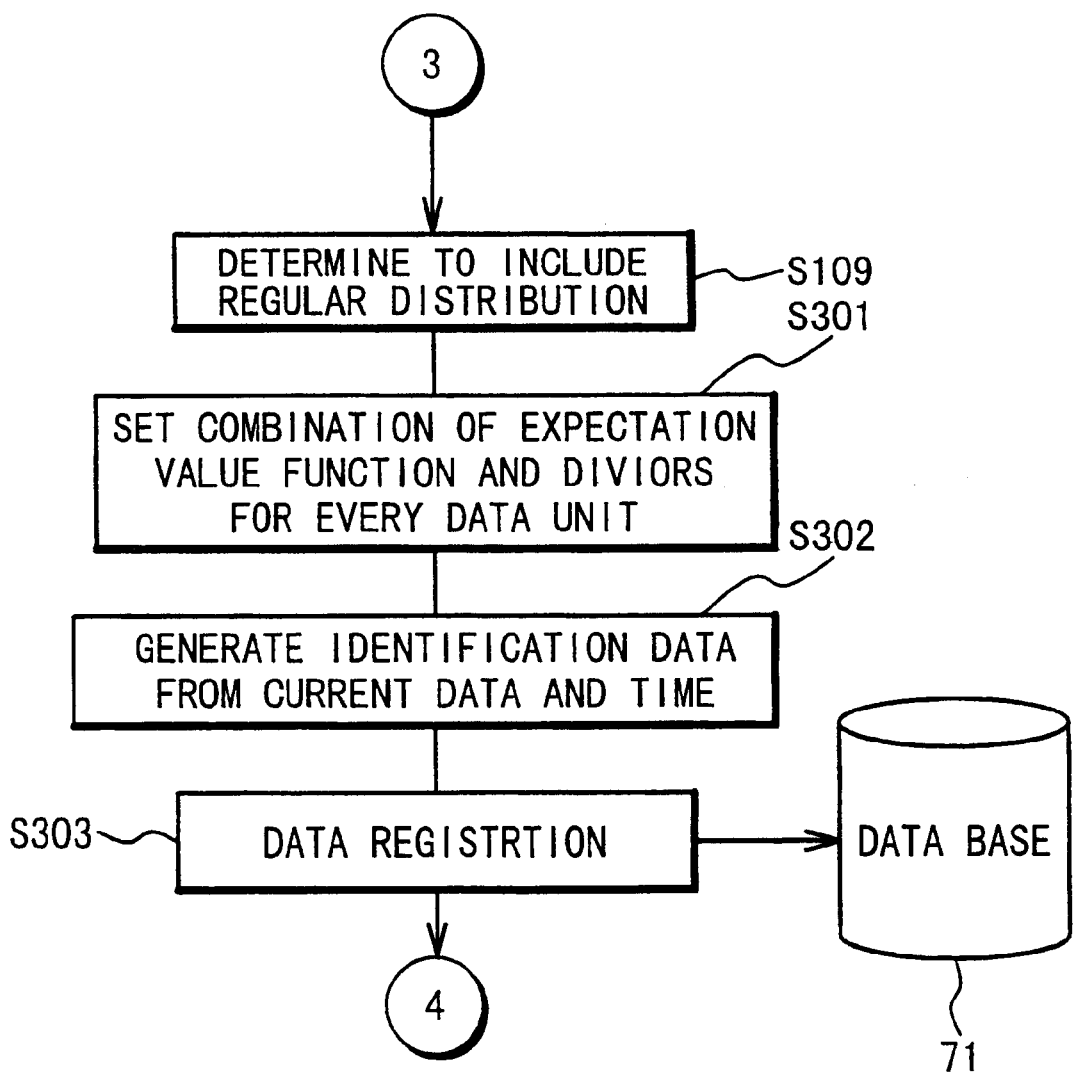

The processing of the flow chart shown in FIGS. 20 and 21 is different from that of the flow chart shown in FIG. 2 in the first embodiment in the processing when it is determined at the step S107 that any one of the expectation function values T(f) exceeds "1" and when it is determined at the step S109 that the fault distribution contains a regular distribution.

When the fault distribution is determined to contain the regular distribution at the step S109, the data base unit 7 sets a set of the expectation function values T(f) as the data unit (Step S301). Next, the data base unit 7 acquires a data indicative of a date and a time at present and generates the identifier data containing the acquired date and time data (Step S302).

Next, the data base unit 7 registers as the data unit, the set of the expectation function values T(f) at the step S301 and the identifier data generated at the step S302 on the data base 71 in correspondence with the previously registered image showing the fault distribution (Step S303). Then, the control advances to the processing of Step S110.

Figure 22:
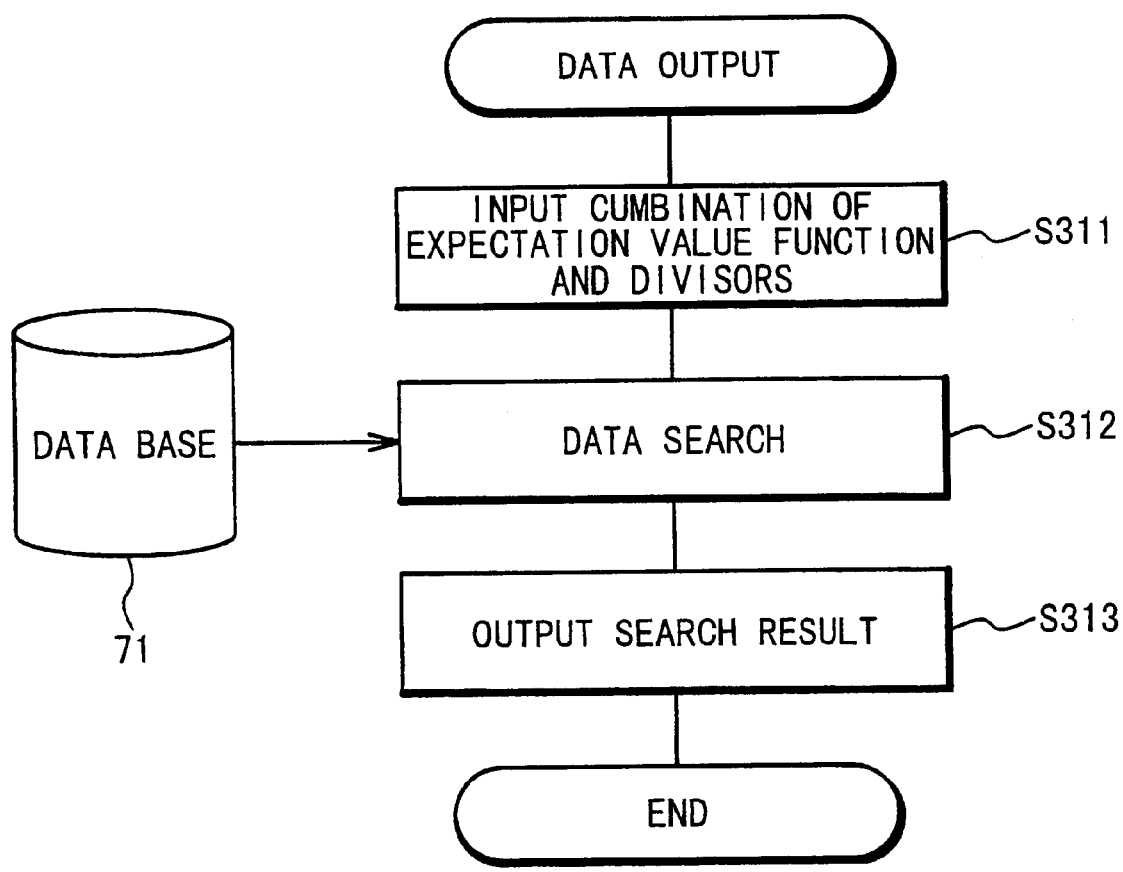
FIG. 22 is a flow chart showing a data retrieving process of the fault distribution analyzing system according to the third embodiment of the present invention.

Next, the outputting operation of the data registered on the data base 71 will be described with reference to the flow chart shown in FIG. 22.

First, an analysis technical experts such as a design person in charge of a semiconductor integrated circuit inputs optional divisors f from the inputting unit of the data base unit 7 (Step S311). The data base unit 7 searches the data base 71 based on the divisors f inputted at the step S311 to acquire the corresponding identifier data and the image showing the fault distribution. Then, the data base unit 7 transfers the searched data to the output unit 4 (Step S312).

Next, the output unit 4 sorts the data transferred from the data base unit 7 based on the date and time data contained in the identifier data. Then, the output unit 4 outputs the data rows of a list in the sorted order (Step S313). It should be noted that the images showing the fault distributions may be outputted when a cursor is positioned on a desired data row of the list and a command is inputted through a mouse click. Then, the processing of this flow chart is ended.

As described above, in the fault distribution analyzing system in the third embodiment, the set of the expectation function values T(f) is stored with respect to the divisors f in correspondence with the image showing the fault distribution. Then, by inputting the optional divisors f, the image showing the corresponding fault distribution is searched from the data base 71. Therefore, the images showing the fault distributions having a common distribution characteristic can be correctly searched.

Also, the output unit 4 sorts and outputs the data rows searched from the data base 71 based on the date and time data in the identifier data. Therefore, it is possible to easily see whether the images showing the fault distributions having the common distribution characteristic increase or decrease as elapse of time.

Modification of the Embodiments

The present invention is not limited to the above-mentioned embodiments and various modifications and various applications are possible. Hereinafter, the modifications of the above-mentioned embodiment of the present invention will be described.

Figure 23:
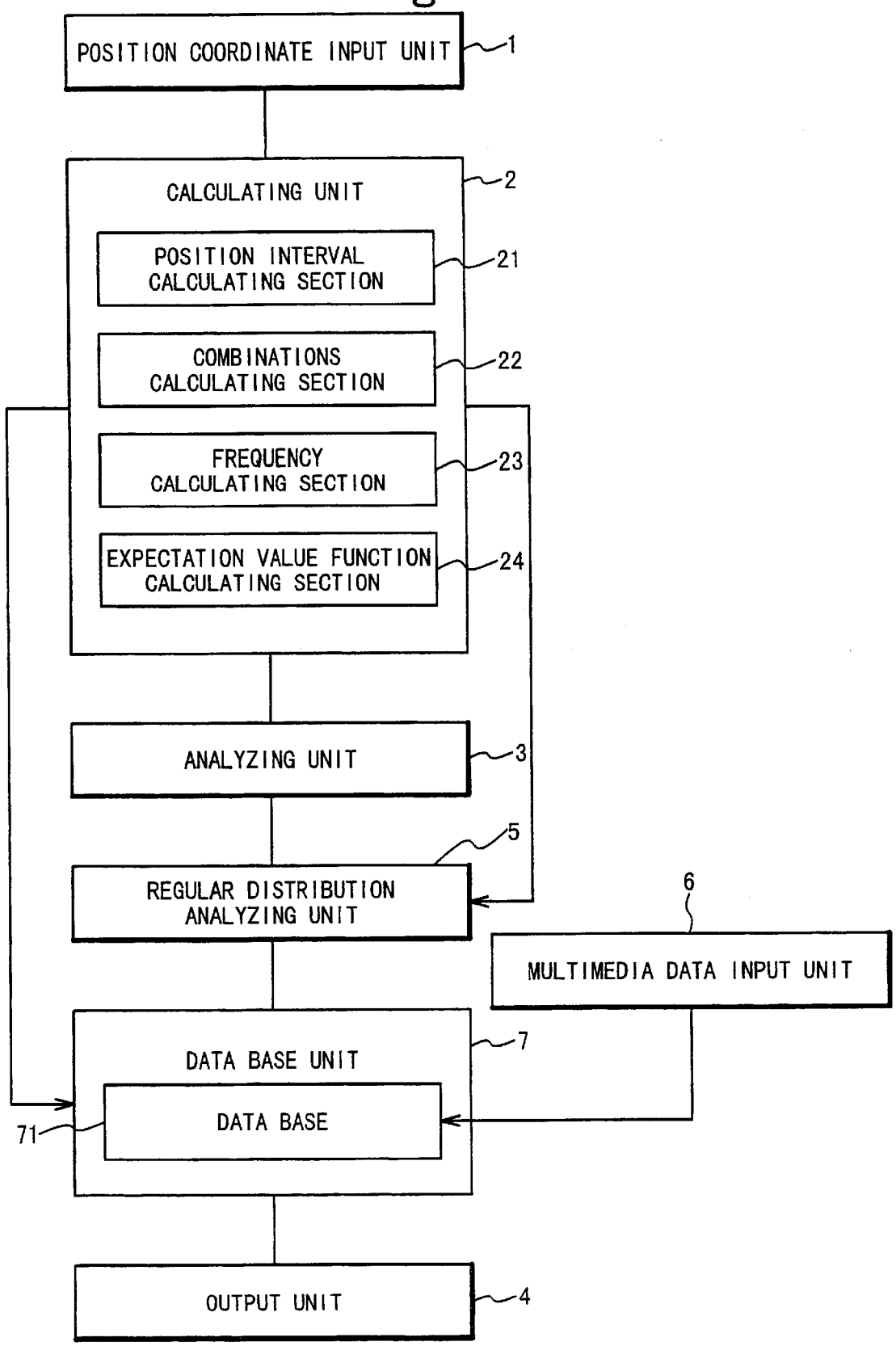
FIG. 23 is a block diagram showing the structure of the fault distribution analyzing system of the semiconductor integrated circuit according to a modification of the above embodiments of the present invention.

In the above-mentioned third embodiment, the multimedia data entry unit 6 and the data base unit 7 are added to the fault distribution analyzing system in the first embodiment. However, the multimedia data entry unit 6 and the data base unit 7 may be added to the fault distribution analyzing system in the second embodiment, as shown in FIG. 23.

Figure 24:
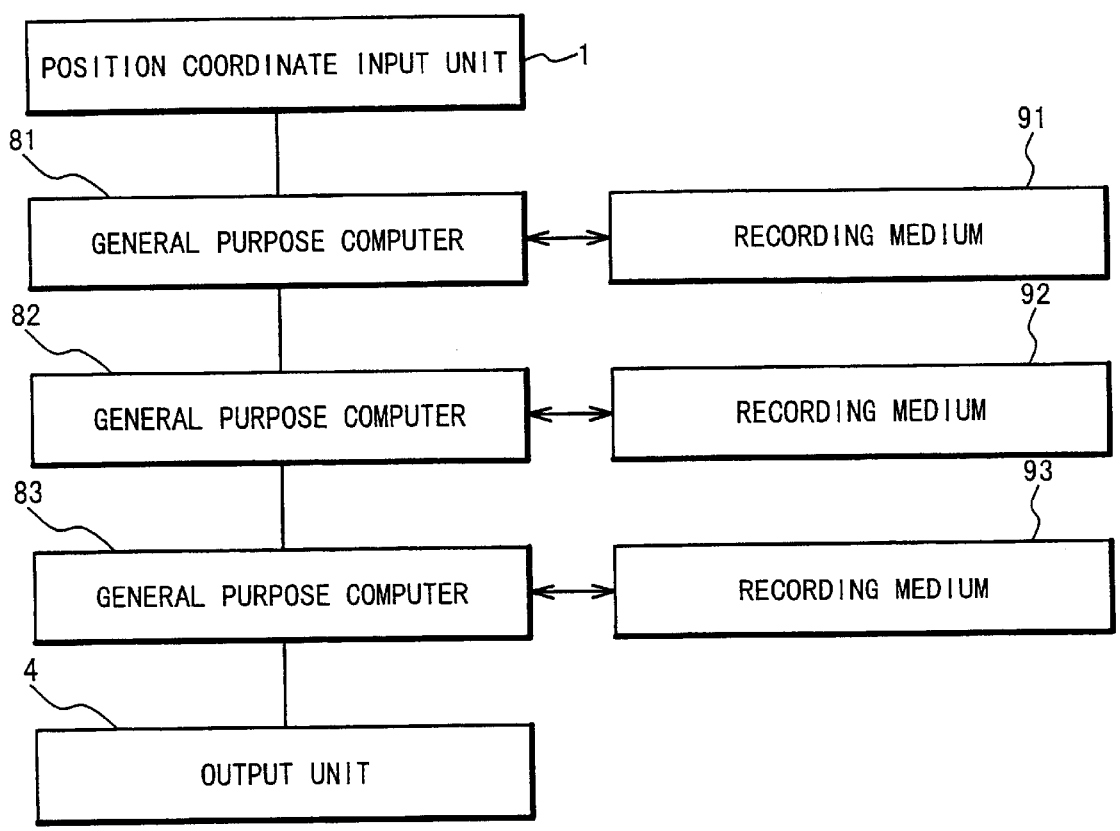
FIG. 24 is a block diagram showing the structure of the fault distribution analyzing system of the semiconductor integrated circuit according to another modification of the above embodiments of the present invention.

In the above first to third embodiments, the calculating unit 2 may realize the position interval calculating section 21, the combinations calculating section 22, the frequency calculating section 23 and the expectation value function calculating section 24 by a computer executing a program. Also, the functions of the analyzing unit 3 and regular distribution analyzing unit 5 may be realized by the computer executing a program. In this case, as shown in FIG. 24, the programs may be stored in a recording media 91 to 93 such as the CD-ROM which can read by the computer, as shown in FIG. 22. When the recording medium is delivered, the programs may be read out from this recording medium and executed by either of the multi-used computers 81 to 83 such as a personal computer and a engineering workstation. It should be noted that the recording media 91 to 93 are divided into the medium which is different respectively and may make an identical medium.

As described above, according to the present invention, it is possible to easily and quickly see whether the distribution of fault elements contained in the semiconductor integrated circuit contains a regular distribution or is an irregular distribution. As the result, it is possible to easily determine whether or not the faults of the semiconductor integrated circuit are caused based on the design.

Also, the data of the position coordinates of the fault elements are converted into the divisors of the position coordinate intervals and the expectation function. Therefore, the data indicative of the tendency of the fault elements contained in the semiconductor integrated circuit can be stored without restriction of the memory capacity.

Moreover, when the distribution of fault elements contained in the semiconductor integrated circuit is determined to contain a regular distribution, the period of the regular distribution can be easily and quickly found.

Moreover, it is possible to easily see how the regular distribution of fault elements of the semiconductor integrated circuit is. Especially, the change of the distributions of fault elements can be easily seen with respect to time by registering in the identifier data.

What is claimed is:

1. A method of analyzing a distribution of fault elements of a semiconductor integrated circuit including a plurality of elements which are repeatedly arranged in a pitch of one length unit in a specific direction, comprising:

generating a position of each of fault elements in said semiconductor integrated circuit;

performing a first determination of whether an appearance expectation value is larger than a reference value, for each of divisors of the number of length units between fault elements, the number of length units being larger than one length unit;

performing a second determination of whether a distribution of said fault elements includes a regular distribution, based on said appearance expectation value and a reference value; and representing the determining result of said second determination.

2. A method according to claim 1, further comprising:

carrying out a third determination of a period of said fault elements in said regular distribution contained in said distribution of fault elements based on said appearance expectation values; and representing said determined period of said fault elements.

3. A method according to claim 1, wherein said performing a second determination further includes:

storing a record of said appearance expectation value for each of said divisors and a date and time data in a data base.

4. A method according to claim 3, wherein said storing includes:

storing data indicative of said distribution of fault elements in said data base in association with said record.

5. A method according to claim 3, further comprising:

searching said data base in response to a search instruction with a target divisor to retrieve said appearance expectation values for said target divisor and said date and time data corresponding to said appearance expectation values; and representing said searched appearance expectation values for said target divisor and said date and time data corresponding to said searched appearance expectation values.

6. A method according to claim 3, further comprising:

performing a third determination of a period of said fault elements in said regular distribution contained in said distribution of fault elements based on said appearance expectation values; and storing said determined period of said fault elements in said data base in addition to said record of said appearance expectation value for each of said divisors and said date and time data.

7. A method according to claim 6, wherein said performing a third determination further includes:

storing data indicative of said distribution of fault elements in said data base in association with said record and said determined period.

8. A method according to claim 6, further comprising:

searching said data base in response to a search instruction with a target divisor to retrieve said appearance expectation values for said target divisor, said date and time data corresponding to said appearance expectation values and said determined period of said fault elements; and representing said searched appearance expectation values for said target divisor and said date and time data corresponding to said appearance expectation values and said determined period of said fault elements.

9. A method according to claim 1, wherein said reference value is 1, and said performing a first determination includes:

calculating an interval between optional two of all said fault elements contained in the semiconductor integrated circuit;

calculating the number of intervals other than 0, as a combination count;

calculating divisors of each of said intervals larger than 1, and for calculating an appearance probability for each of said divisors based on the number of times of appearance of each of said divisors and said combination count; and calculating said appearance expectation value for each of said divisors based on said corresponding one of said appearance probabilities and said each divisors.

10. A method according to claim 9, wherein said calculating said appearance expectation value includes:

multiplying each of said appearance probabilities with corresponding one of said divisors, to calculate said appearance expectation value.

11. A method according to claim 9, further comprising:

determining the largest one of said appearance expectation values and the next largest one of said appearance expectation values;

determining an absolute value of a difference between a first one of said divisors corresponding to the largest appearance expectation value and a second one of said divisors corresponding to the next largest appearance expectation value; and determining a fact that said distribution of fault elements contains a regular distribution with a period based on said absolute value of said difference.

12. A method according to claim 11, wherein said determining a fact includes:

determining a fact that said distribution of fault elements contains said regular distribution with said period having said first divisor, when said absolute value of said difference is equal to said first divisor.

13. A method according to claim 11, wherein said determining a fact includes:

determining a fact that said distribution of fault elements contains said regular distribution with said period, when said absolute value of said difference is not equal to said first divisor, but when said absolute value of said difference is within a predetermined value.

14. A fault distribution analyzing system of a semiconductor integrated circuit including a plurality of elements which are repeatedly arranged in a pitch of one length unit in a specific direction, comprising:

an output unit;

an input unit supplying a position of each of fault elements in said semiconductor integrated circuit; and a first processor which:

determines whether an appearance expectation value is larger than a reference value, for each of divisors of the number of length units between fault elements, the number of length units being larger than one length unit;

determines that a distribution of said fault elements includes a regular distribution, when said appearance expectation value is larger than said reference value; and outputs the determining result of said second determining means to said output unit.

15. A fault distribution analyzing system according to claim 14, further comprising a second processor which:
   determines a period of said fault elements in said regular distribution contained in said distribution of fault elements based on said appearance expectation values; and
   outputs said determined period of said fault elements to said output unit.

16. A fault distribution analyzing system according to claim 15, further comprising a third processor which:
   has a data base, and
   stores a record of said appearance expectation value for each of said divisors and a date and time data in said data base.

17. A fault distribution analyzing system according to claim 16, wherein said third processor stores data indicative of said distribution of fault elements in said data base in association with said record.

18. A fault distribution analyzing system according to claim 16, wherein said third processor:
   searches said data base in response to a search instruction with a target divisor to retrieve said appearance expectation values for said target divisor and said date and time data corresponding to said appearance expectation values; and
   outputs said searched appearance expectation values for said target divisor and said date and time data corresponding to said searched appearance expectation values to said output unit.

19. A fault distribution analyzing system according to claim 16, wherein said third processor:
   determines a period of said fault elements in said regular distribution contained in said distribution of fault elements based on said appearance expectation values; and
   stores said determined period of said fault elements in said data base in addition to said record of said appearance expectation value for each of said divisors and said date and time data.

20. A fault distribution analyzing system according to claim 19, wherein said third processor stores data indicative of said distribution of fault elements in said data base in association with said record and said determined period.

21. A fault distribution analyzing system according to claim 19, wherein said third processor:
   searches said data base in response to a search instruction with a target divisor to retrieve said appearance expectation values for said target divisor, said date and time data corresponding to said appearance expectation values and said determined period of said fault elements; and
   outputs said searched appearance expectation values for said target divisor and said date and time data corresponding to said appearance expectation values and said determined period of said fault elements to said output unit.

22. A fault distribution analyzing system according to claim 15, wherein said reference value is 1, and
   wherein said first processor:
      calculates an interval between optional two of all said fault elements contained in the semiconductor integrated circuit;
      calculates the number of intervals other than 0, as a combination count;
      calculates divisors of each of said intervals larger than 1, and for calculating an appearance probability for each of said divisors based on the number of times of appearance of each of said divisors and said combination count; and
      calculates said appearance expectation value for each of said divisors based on said corresponding one of said appearance probabilities and said each divisors.

23. A fault distribution analyzing system according to claim 22, wherein said first processor multiplies each of said appearance probabilities with corresponding one of said divisors, to calculate said appearance expectation value.

24. A fault distribution analyzing system according to claim 22, wherein said second processor:
   determines the largest one of said appearance expectation values and the next largest one of said appearance expectation values;
   determines an absolute value of a difference between a first one of said divisors corresponding to the largest appearance expectation value and a second one of said divisors corresponding to the next largest appearance expectation value; and
   determines that said distribution of fault elements contains a regular distribution with a period based on said absolute value of said difference.

25. A fault distribution analyzing system according to claim 24, wherein when said absolute value of said difference is equal to said first divisor, said second processor determines that said distribution of fault elements contains said regular distribution with said period having said first divisor.

26. A fault distribution analyzing system according to claim 24, wherein when said absolute value of said difference is not equal to said first divisor, but when said absolute value of said difference is within a predetermined value, said second processor determines that said distribution of fault elements contains said regular distribution with said period.

27. A recording medium in which a program is stored to execute a method of analyzing a distribution of fault elements of a semiconductor integrated circuit including a plurality of elements which are repeatedly arranged in a pitch of one length unit in a specific direction, comprising:
   generating a position of each of fault elements in said semiconductor integrated circuit;
   performing a first determination of whether an appearance expectation value is larger than a reference value, for each of divisors of the number of length units between fault elements, the number of length units being larger than one length unit;
   performing a second determination of whether a distribution of said fault elements includes a regular distribution, based on said appearance expectation value and a reference value; and
   representing the determining result of said second determination.

28. A recording medium according to claim 27, further comprising:
   carrying out a third determination of a period of said fault elements in said regular distribution contained in said distribution of fault elements based on said appearance expectation values; and
   representing said determined period of said fault elements.

29. A recording medium according to claim 27, wherein said performing a second determination further includes:
   storing a record of said appearance expectation value for each of said divisors and a date and time data in a data base.

30. A recording medium according to claim 27, wherein said storing includes:

storing data indicative of said distribution of fault elements in said data base in association with said record.

31. A recording medium according to claim 27, further comprising:

searching said data base in response to a search instruction with a target divisor to retrieve said appearance expectation values for said target divisor and said date and time data corresponding to said appearance expectation values; and representing said searched appearance expectation values for said target divisor and said date and time data corresponding to said searched appearance expectation values.

32. A recording medium according to claim 27, further comprising:

performing a third determination of a period of said fault elements in said regular distribution contained in said distribution of fault elements based on said appearance expectation values; and storing said determined period of said fault elements in said data base in addition to said record of said appearance expectation value for each of said divisors and said date and time data.

33. A recording medium according to claim 32, wherein said performing a third determination further includes:

storing data indicative of said distribution of fault elements in said data base in association with said record and said determined period.

34. A recording medium according to claim 32, further comprising:

searching said data base in response to a search instruction with a target divisor to retrieve said appearance expectation values for said target divisor, said date and time data corresponding to said appearance expectation values and said determined period of said fault elements; and representing said searched appearance expectation values for said target divisor and said date and time data corresponding to said appearance expectation values and said determined period of said fault elements.

35. A recording medium according to claim 27, wherein said reference value is 1, and said performing a first determination includes:

calculating an interval between optional two of all said fault elements contained in the semiconductor integrated circuit;

calculating the number of intervals other than 0, as a combination count;

calculating divisors of each of said intervals larger than 1, and for calculating an appearance probability for each of said divisors based on the number of times of appearance of each of said divisors and said combination count; and calculating said appearance expectation value for each of said divisors based on said corresponding one of said appearance probabilities and said each divisors.

36. A recording medium according to claim 35, wherein said calculating said appearance expectation value includes:

multiplying each of said appearance probabilities with corresponding one of said divisors, to calculate said appearance expectation value.

37. A recording medium according to claim 35, further comprising:

determining the largest one of said appearance expectation values and the next largest one of said appearance expectation values;

determining an absolute value of a difference between a first one of said divisors corresponding to the largest appearance expectation value and a second one of said divisors corresponding to the next largest appearance expectation value; and determining a fact that said distribution of fault elements contains a regular distribution with a period based on said absolute value of said difference.

38. A recording medium according to claim 37, wherein said determining a fact includes:

determining a fact that said distribution of fault elements contains said regular distribution with said period having said first divisor, when said absolute value of said difference is equal to said first divisor.

39. A recording medium according to claim 37, wherein said determining a fact includes:

determining a fact that said distribution of fault elements contains said regular distribution with said period, when said absolute value of said difference is not equal to said first divisor, but when said absolute value of said difference is within a predetermined value.

* * * * *